(12) United States Patent
Matsui et al.

(10) Patent No.: US 10,186,550 B2
(45) Date of Patent: Jan. 22, 2019

(54) SENSOR DEVICE MODULE

(71) Applicant: Mitsubishi Electric Corporation, Tokyo (JP)

(72) Inventors: Hirobumi Matsui, Tokyo (JP); Yuji Kawano, Tokyo (JP); Shinichi Hosomi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 31 days.

(21) Appl. No.: 15/591,187

(22) Filed: May 10, 2017

(65) Prior Publication Data
US 2018/0145111 A1 May 24, 2018

(30) Foreign Application Priority Data

Nov. 22, 2016 (JP) ................................. 2016-226434

(51) Int. Cl.
*H01L 27/22* (2006.01)
*G01R 33/09* (2006.01)

(52) U.S. Cl.
CPC ............ *H01L 27/22* (2013.01); *G01R 33/093* (2013.01)

(58) Field of Classification Search
CPC .............................. H01L 27/22; G01R 33/093
USPC ......................................................... 257/427
See application file for complete search history.

(56) References Cited

U.S. PATENT DOCUMENTS

| 6,239,595 B1 | 5/2001 | Shinjo et al. |
| 6,426,620 B1 | 7/2002 | Taguchi et al. |
| 2002/0153881 A1 | 10/2002 | Taguchi et al. |
| 2008/0218163 A1 | 9/2008 | Hosomi et al. |

FOREIGN PATENT DOCUMENTS

| JP | 3544141 B2 | 7/2004 |
| JP | 2008-224288 A | 9/2008 |

OTHER PUBLICATIONS

Communication dated Sep. 19, 2017, from the Japanese Patent Office in counterpart application No. 2016-226434.

*Primary Examiner* — Hrayr A Sayadian
(74) *Attorney, Agent, or Firm* — Sughrue Mion, PLLC; Richard C. Turner

(57) ABSTRACT

A sensor device module comprises: a substrate having a sensor element covered with a protective film, an integrated circuit formed on the substrate, and a bonding pad part formed on the substrate; wherein the integrated circuit and the sensor element are connected at a contact part, and the sensor element and the contact part have a metal thin film layer which consists of first metal layers and second metal layers, an insulating film which is formed on the metal thin film layer and made from the same material as the protective film, and an exfoliation sacrifice layer which is formed on the insulating film and in contact with the protective film, further wherein an upper most film or a lower most film of the exfoliation sacrifice layer is made from the same material as an upper most film of the metal thin film layer.

13 Claims, 22 Drawing Sheets

US 10,186,550 B2

SENSOR DEVICE MODULE

FIELD OF THE INVENTION

The present invention relates to a sensor device module. More particularly, the present invention relates to a sensor device module which is provided with a layered metal thin film.

BACKGROUND OF THE INVENTION

As a sensor device module which contains a layered metal thin film, devised is a magnetic sensor device module which includes a magnetic resistance thin film layer, formed on the semiconductor substrate thereof. For instance, the structure of a magnetic sensor device module in which a sensor formation field and an integrated circuit which performs predetermined arithmetic processing are arranged on the same plane is disclosed (refer to Patent Document 1, for example). As a foundation layer (insulating film) of the magnetic resistance thin film layer, Si thermal oxidation film is formed. At the next step, a metal electrode (aluminum film) for connecting electrically the integrated circuit and the magnetic resistance thin film layer is formed.

In order to connect the metal electrode and the magnetic resistance thin film layer electrically, a magnetic layer which consists of a Fe(x) Co(1−x) (0≤x≤0.3) layer and a non-magnetic layer which consists of a Cu layer are stacked one above the other, so that the metal electrode may be covered by those layers. At the final step, a protective film is formed. It is to be noted that the magnetic layers which each consists of a Fe(x) Co(1−x) (0≤x≤0.3) layer and the non-magnetic layers which each consists of a Cu layer will become a giant magnetoresistance element (GMR element: Giant Magnetoresistance element). As for other GMR elements, Fe/Cr, Permalloy/Cu/Co/Cu, Co/Cu, and Fe-Co/Cu are disclosed.

Further, disclosed is a structure where an interlayer insulating film is used for flattening a difference in level on the surface of the integrated circuit which performs predetermined arithmetic processing (refer to Patent Document 2, for example). The magnetic sensor device module includes a sensor formation field which is formed right above the integrated circuit. The difference in level on the surface of the integrated circuit is made flat by using a flattening film. At a first step, a silicon nitride film is formed as a foundation layer (insulating film) of the magnetic resistance thin film layer. At the next step, in order to expose the metal electrode of the integrated circuit, a portion of the protective film, the flattening film, and the insulating film is opened, and then a contact hole is formed.

Moreover, metallic wiring is processed on the silicon nitride film, and then a metal electrode is formed. The metal electrode is connected with a metal electrode of the integrated circuit via the contact hole. As the metal electrode, an aluminum film, which is generally used in the present technical field, is used. In order to connect the metal electrode and the magnetic resistance thin film layer electrically, a magnetic layer which consists of a Fe(x) Co(1−x) (0≤x≤0.3) layer and a non-magnetic layer which consists of a Cu layer are stacked one above the other, so that the metal electrode may be covered by those layers. At the final step, a silicon nitride film is formed as a protective film. The magnetic layers which each consists of a Fe(x) Co(1−x) (0≤x≤0.3) layer and the non-magnetic layers which each consists of a Cu layer function as a magnetic resistance thin film layer.

In the above mentioned contact structure of the metal electrode and the magnetic resistance thin film layer, the magnetic resistance thin film layer is comparatively thin with respect to the film thickness of the metal film. Accordingly, the contact structure becomes unstable in electrical connection, and needs to be improved in reliability. For example, in Patent Document 1, a feature of wet etching is employed to form interconnection wiring which is made from an aluminum film. The feature is in that wet etching is isotropic etching, and then, the end of the aluminum film is processed into a tapered shape. At the connection part between the magnetic resistance thin film layer and the aluminum electrode, a cross sectional shape is formed which has an advantage in mechanical stiffness.

CITATION LIST

Patent Literature

Patent Document 1: JP 3544141 B2
Patent Document 2: JP 2008-224288 A

SUMMARY OF THE INVENTION

Technical Problem

It is to be noted that a sensor device module needs to maintain its function as a magnetic sensor even under severe environments, if the device module expects to be applied to a sensor for in car use. The severe environments are supposed to include a heat cycle endurance test whose temperature amplitude ranges from −40° C. to 150° C., for instance. In the magnetic sensor device module of a conventional structure, there are cases where exfoliations may be produced at the protective film and the magnetic resistance thin film layer, by the heat cycle endurance test, which is to be carried out after the magnetic sensor device module is assembled in a mold package.

In the sensor chip, a resin which is to be used for a mold package is formed to mold along the irregularity on the surface of the chip. In the heat cycle endurance test, the mold resin contracts at a low temperature side, and the chip surface of a magnetic sensor device module is subjected to stress. In that case, exfoliation may occur at the interface between a protective film and a magnetic resistance thin film layer, which are comparatively weak in the adhesion property. In particular, the stress concentrates on the contact part, which has a large difference in level, and then the protective film and the magnetic resistance thin film layer may exfoliate.

There is disclosed a structure where a sensor field is formed on an integrated circuit, by flattening a difference in level of the integrated circuit (refer to Patent Document 2, for example). Differences in level on a sensor chip surface are generated only by metal electrodes, and then the stress tends to concentrate thereon. Accordingly, it is possible to consider the structure where the metal electrodes of the integrated circuit are connected directly with the magnetic resistance thin film layer, without forming the metal wiring to a contact hole. Even in this structure, stress may concentrate on differences in level of the contact hole, and there are cases where the similar issue may be generated.

Further, owing to the internal stress of a protective film, the protective film and the magnetic resistance thin film layer, which are comparatively weak in adhesion property, may exfoliate. By decreasing the film thickness of the protective film, it is possible to reduce the internal stress and to control the exfoliation. However, for example, in order to protect the integrated circuit from physical shocks in a mounting process, it is necessary to form the protective film thickly. Therefore, exfoliation may arise in a protective film and a magnetic resistance thin film layer, depending on the film thickness of the protective film.

The present invention is made in order to solve the subject in the above mentioned sensor device modules. In other words, a protective film and a magnetic resistance thin film layer may exfoliate, due to the internal stress of the protective film, the external stress from the mold resin applied through the protective film and others. The present invention aims at preventing the decline in the reliability due to the exfoliation of a protective film and a magnetic resistance thin film layer, and providing the sensor device module which is excellent in the resistance to the environment.

Solution to Problem

A sensor device module according to the present invention comprises: a substrate on which a sensor element that is covered with a protective film and has a pattern is formed, an integrated circuit which is formed on the substrate, and processes an output of the sensor element to calculate a sensor signal, and a bonding pad part which is formed on the substrate and into which electric power supplied to the integrated circuit is inputted; wherein the integrated circuit and the sensor element are connected at a contact part, and the sensor element and the contact part have a layered metal thin film which consists of first metal layers and second metal layers, each layer stacked one above the other, an insulating film which is formed on the layered metal thin film and made from the same material as the protective film, and an exfoliation sacrifice film which is formed on the insulating film and in contact with the protective film, further wherein an upper most layer or a lower most layer of the exfoliation sacrifice film is made from the same material as an upper most layer of the layered metal thin film.

Advantageous Effects of Invention

A sensor device module according to the present invention comprises: a substrate on which a sensor element that is covered with a protective film and has a pattern is formed, an integrated circuit which is formed on the substrate, and processes an output of the sensor element to calculate a sensor signal, and a bonding pad part which is formed on the substrate and into which electric power supplied to the integrated circuit is inputted; wherein the integrated circuit and the sensor element are connected at a contact part, and the sensor element and the contact part have a layered metal thin film which consists of first metal layers and second metal layers, each layer stacked one above the other, an insulating film which is formed on the layered metal thin film and made from the same material as the protective film, and an exfoliation sacrifice film which is formed on the insulating film and in contact with the protective film, further wherein an upper most layer or a lower most layer of the exfoliation sacrifice film is made from the same material as an upper most layer of the layered metal thin film. By these features, it is possible to produce exfoliation in the protective film and the exfoliation sacrifice film, and to protect the layered metal thin film. As a result, it becomes possible to prevent properly the decline in the reliability due to the exfoliation of a protective film and a magnetic resistance thin film layer, and then the present invention can provide a sensor device module which is excellent in the resistance to the environment.

DESCRIPTION OF EMBODIMENTS

Figure 1:
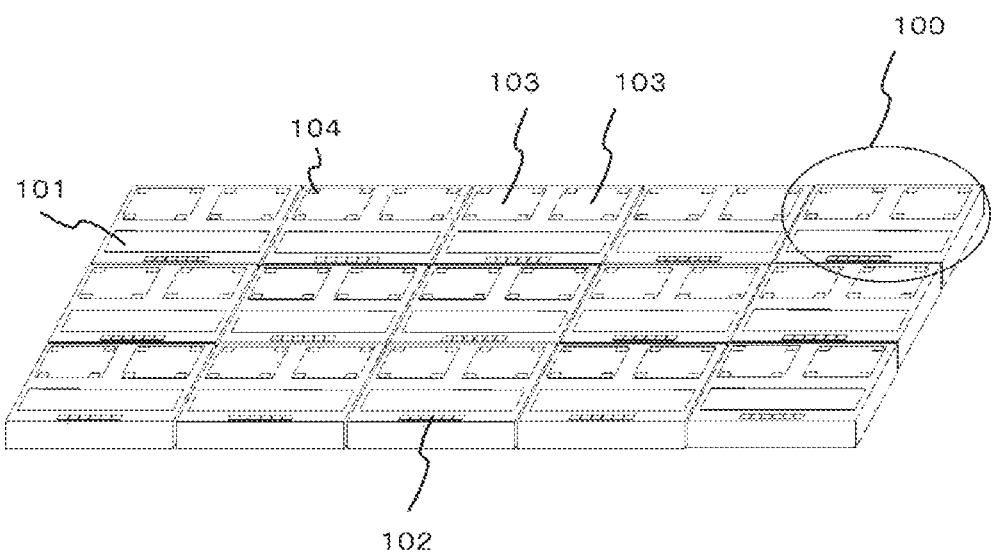
FIG. 1 is a bird's eye view for showing magnetic sensor device modules in accordance with Embodiments 1 and 2 of the present invention.

Hereinafter, a sensor device module according to the embodiments of the present invention will be described with reference to drawings. Incidentally, the same reference numerals are given to those identical or similar to constitutional portions in respective drawings and the size and/or the scale size of the corresponding respective constitutional portions are respectively independent. For example, when the identical constitutional portions, which are not changed, are shown, the size and/or the scale size of the identical constitutional portions may different among sectional views in which a part of the configuration is changed. Furthermore, although the configurations of the sensor device module are further actually provided with a plurality of members, for ease of explanation, only portions necessary for explanation will be described and other portions are omitted.

Embodiment 1

Among sensor device modules, the present embodiment relates particularly to a magnetic sensor device module in which a magnetic sensor element is formed on the same plane as an integrated circuit is to be formed. The present embodiment can be widely applied to sensor device modules which are provided with a layered metal thin film. FIG. 1 shows magnetic sensor device modules 100 (sensor device module) in accordance with Embodiment 1. The magnetic sensor device module 100 is formed on a wafer. This wafer is to be sliced, and then, magnetic sensor device modules 100 are obtained. The magnetic sensor device module 100 includes an integrated circuit 101, a bonding pad part 102, and a sensor field 103. A magnetic sensor element (magnetic resistance thin film layer) is formed in the sensor field 103. From the bonding pad part 102, voltage and others for driving the device (integrated circuit 101) are supplied. A magnetic sensor device module 100 is provided with two sensor fields 103. Four contact parts 104 are formed in each of the sensor fields 103. The magnetic sensor element responds to a magnetic field, and the integrated circuit 101 reads out the detected magnetic field as an electric signal (sensor signal). The bonding pad part 102 is provided in order to read the sensor signal and output it to the outside.

Figure 2:
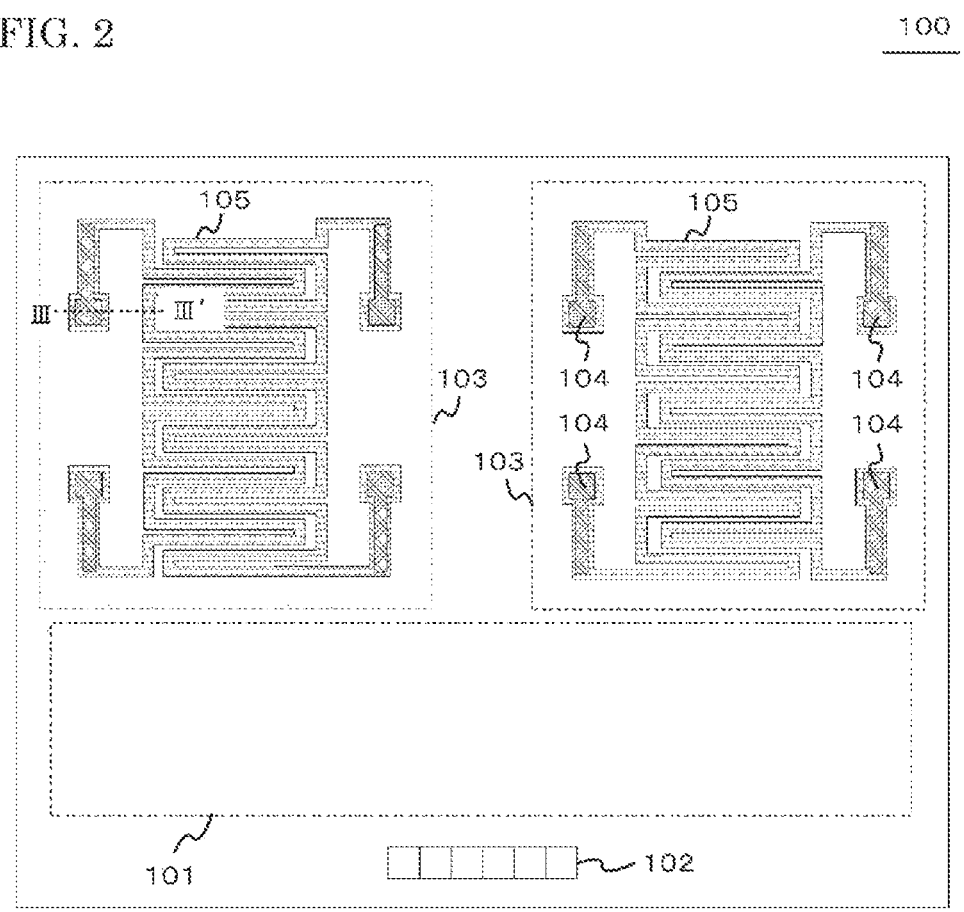
FIG. 2 is a top view for showing the magnetic sensor device module in accordance with Embodiment 1 of the present invention.

FIG. 2 shows a top view of the magnetic sensor device chip in accordance with the present embodiment. Contact parts 104 and a sensor element 105 are formed in the sensor field 103 of the magnetic sensor device module 100. The integrated circuit 101 receives a signal from the sensor element 105 which responded to a magnetic field, performs predetermined operation processing, and reads it out as an electric signal (sensor signal). A bonding pad part 102 is provided for supplying voltage and the like for driving the device (integrated circuit 101), and reading the signal and outputting it to the outside. The sensor element 105 (magnetic resistance thin film layer) of the sensor field 103 and metal electrodes of the integrated circuit 101 are electrically connected at the contact part 104 of the sensor field 103. The integrated circuit 101 is arranged in an area different from that of the sensor field 103. The sensor element 105 is covered with a protective film, and has a predetermined pattern.

Figure 3:
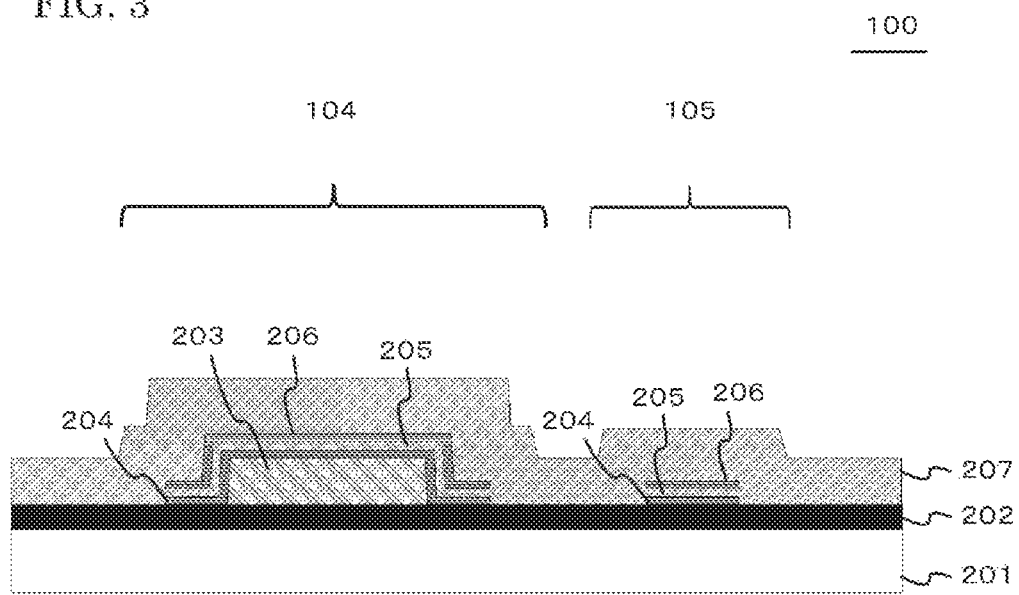
FIG. 3 is a sectional view for showing the magnetic sensor device module in accordance with Embodiment 1 of the present invention.

FIG. 3 shows a fragmentary and sectional view of the sensor field 103 in the magnetic sensor device module 100 (refer to the contact part 104 and the sensor element 105 shown in FIG. 2). The magnetic sensor device module 100 according to the present embodiment includes a substrate 201, an insulating film 202, a metal electrode 203, a magnetic resistance thin film layer 204, an insulating film 205, and an exfoliation sacrifice film 206 and a protective film 207. The integrated circuit 101 is formed on the substrate 201. The insulating film 202 serves as a foundation layer of the magnetic resistance thin film layer 204. The metal electrode 203 is formed on the insulating film 202, and connects the magnetic resistance thin film layer 204 and the integrated circuit 101.

At the contact part 104, the metal electrode 203 is covered with the magnetic resistance thin film layer 204, the insulating film 205, and the exfoliation sacrifice film 206. Furthermore, on the insulating film 202, there is provided a sensor element 105 which includes a magnetic resistance thin film layer 204, an insulating film 205, and an exfoliation sacrifice film 206. The magnetic resistance thin film layer 204, the insulating film 205, and the exfoliation sacrifice film 206 are formed in the pattern of a desired shape. The protective film 207 covers the magnetic resistance thin film layer 204, the insulating film 205, and the exfoliation sacrifice film 206. The magnetic resistance thin film layer 204 and the metal electrode 203 are electrically connected at the contact part 104.

It is to be noted that, although the sectional drawing shows that the magnetic resistance thin film layer 204, the insulating film 205, and the exfoliation sacrifice film 206 are formed in the same shape, the magnetic resistance thin film layer 204, the insulating film 205, and the exfoliation sacrifice film 206 need not to be formed in the same shape. The insulating film 205 and the exfoliation sacrifice film 206 may be formed so as to cover the magnetic resistance thin film layer 204. Although the sensor element 105 and the contact part 104 are provided with exfoliation sacrifice films 206, the exfoliation sacrifice film may be provided for either the sensor element or the contact part. Although the insulating film and the exfoliation sacrifice film are each formed of a single layer here, a period consisting of an insulating film and an exfoliation sacrifice film may be stacked in plural repeatedly.

Figure 4:
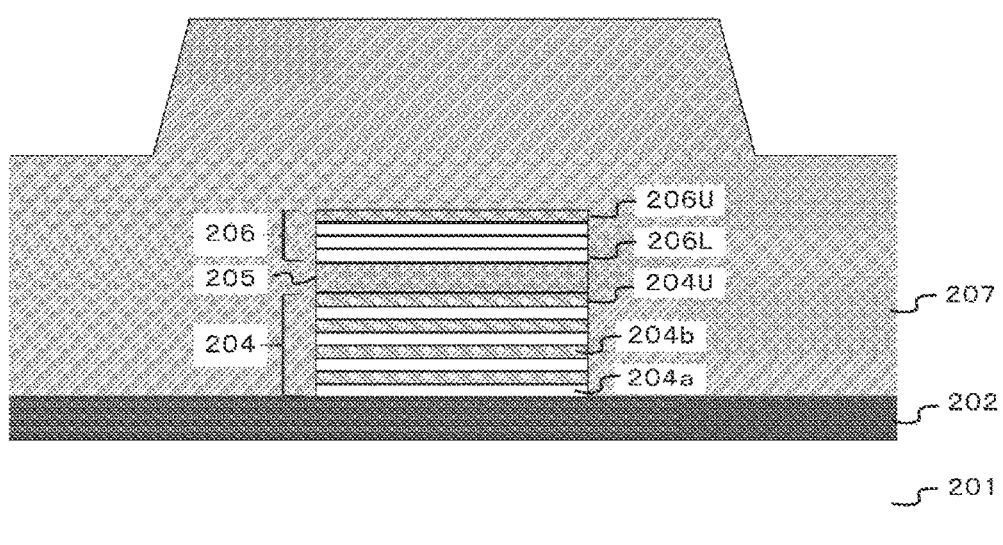
FIG. 4 is a first detailed sectional view for showing the magnetic sensor device module in accordance with Embodiment 1 of the present invention.
Figure 5:
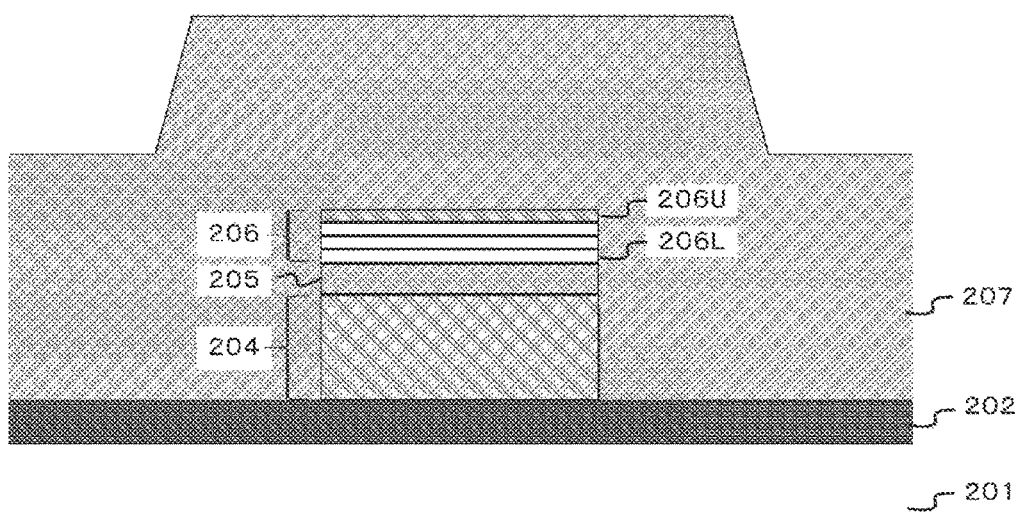
FIG. 5 is a second detailed sectional view for showing the magnetic sensor device module in accordance with Embodiment 1 of the present invention.

FIG. 4 is a first sectional view which shows the details of a sensor element. The magnetic resistance thin film layer 204 consists of first metal layers 204a and second metal layers 204b, which are each stacked one after the other. In the drawing, the magnetic resistance thin film layer 204 is formed of four layers of the first metal layer 204a and four layers of the second metal layer 204b. The exfoliation sacrifice film 206 consists of a four layered film in the drawing. FIG. 5 is a second sectional view which shows the details of the sensor element. The magnetic resistance thin film layer 204 consists of a single metal layer. The exfoliation sacrifice film 206 consists of a four layered film in the drawing. In the present embodiment, the magnetic resistance thin film layer 204 and the insulating film 205 (hereafter referred to as IN3), the insulating film 205 and the exfoliation sacrifice film 206 (hereafter referred to as IN2), and the exfoliation sacrifice film 206 and protective film 207 (hereafter referred to as IN1) are denoted as a contact film.

In the present embodiment, the protective film 207 and the insulating film 205 need to be made from the same material, and at least one of the upper most layer 206U and the lower most layer 206L, which constitute the exfoliation sacrifice film 206, needs to be made from the same material with that of the upper most layer 204U of the magnetic resistance thin film layer 204. It is to be noted that, when the upper most layer 206U and the lower most layer 206L of the exfoliation sacrifice film 206 are both made from the same material with that of the upper most layer 204U of the magnetic resistance thin film layer 204, the contact surfaces of IN1, IN2, and IN3 become all the same in composition. Accordingly, those contact surfaces are equivalent in adhesion property. When stress is applied from a protective film to a contact surface, the stress to lower layers is reduced by the change in shape of the exfoliation sacrifice film, for which a metal film is employed. Furthermore, when the stress, which is strong enough to cause the exfoliation of the protective film, is applied to the protective film, an exfoliation is produced at IN1. In this case, the exfoliation is produced at the upper layers of the insulating film 205. Thereby the magnetic resistance thin film layer 204 can be protected.

It is to be noted that, when the upper most layer of the exfoliation sacrifice film is made from the same material with that of the upper most layer of the magnetic resistance thin film layer, the contact surfaces of IN1 and IN3 become the same in composition. Accordingly, those contact surfaces are equivalent in adhesion property. When stress is applied from a protective film to the contact surfaces, the stress to lower layers is reduced by the change in shape of the exfoliation sacrifice film, for which a metal film is employed. Furthermore, when the stress, which is strong enough to cause the exfoliation of the protective film, is applied to the protective film, an exfoliation is produced at IN1 or IN2. In this case, the exfoliation is produced at the upper layers of the insulating film 205. Thereby the magnetic resistance thin film layer 204 can be protected.

It is to be noted that, when the lower most layer 206L of the exfoliation sacrifice film 206 is made from the same material with that of the upper most layer 204U of the magnetic resistance thin film layer 204, the contact surfaces of IN2 and IN3 become the same in composition. Accordingly, those contact surfaces are equivalent in adhesion property. When stress is applied from a protective film to the contact surfaces, the stress to lower layers is reduced by the change in shape of the exfoliation sacrifice film, for which a metal film is employed. Furthermore, when the stress, which is strong enough to cause the exfoliation of the protective film, is applied to the protective film, an exfoliation is produced at IN1 or IN2. In this case, the exfoliation is produced at the upper layers of the insulating film 205. Thereby the magnetic resistance thin film layer 204 can be protected.

In the next paragraphs, descriptions are made on the manufacturing method of the magnetic sensor device module of the present embodiment with reference to drawings. FIGS. 6A to 6E are sectional views for showing the processes of manufacturing the magnetic sensor device module according to Embodiment 1 of the present invention (refer to the sectional view of FIG. 3). Hereinafter, the processes which were employed in the present embodiment are described step by step. The detailed configurations of the bonding pad and the integrated circuit, which are irrelevant to the features of the present invention, are omitted.

Figure 6A:
FIGS. 6A to 6E are sectional views for showing Processes A to E of the magnetic sensor device module in accordance with Embodiment 1 of the present invention.

At first, in the process of FIG. 6A, an insulating film 202 which serves as the foundation layer of a magnetic resistance thin film layer is prepared. Here, it is preferable to form a silicon nitride film as an insulating film 202, by using a PECVD (Plasma-Enhanced Chemical Vapor Deposition) coating unit. Here, it is desirable to set up the conditions at the time of forming silicon nitride films with a timely response so that the film stress may become small. In more precise terms, the film formation conditions may be adjusted so that film stress may become no larger than $\pm 1.0 \times 10^8$ N/m$^2$. Moreover, as for the film thickness of the insulating film, 0.5 μm or so is preferred from the viewpoint of a magnetic resistance film formation process. Furthermore, there are not any particular restrictions on the material which is to be used for forming the insulating film 202, as far as the material can be used for forming an insulating film in the present technical field.

Figure 6B:
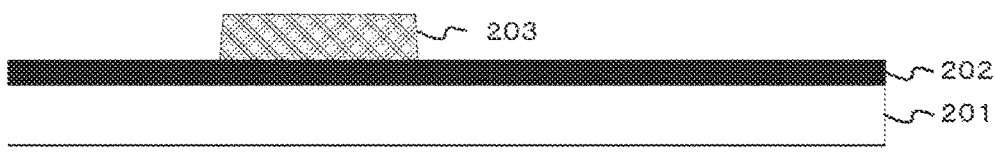

At the next step, in the process of FIG. 6B, a metallic wiring which is to be used as a metal electrode 203 is formed. Here, as the metallic wiring, it is preferable to form an aluminum film, by using a PVD (Physical Vapor Deposition) coating unit. Moreover, as for the film thickness of the aluminum film, 1 μm or so is preferred. The film thickness of the aluminum film may be set at a film thickness which has sufficient function. The film thickness which has sufficient function means a case where the film can ensure the reliability, even if an electric and physical stress is applied to the metallic wiring. It is to be noted that, a conventionally and publicly known material can be used as the metal electrode 203.

For example, AlSi, AlSiCu, AlCu, Al, Cu and the like can be used as the material of metal wiring. AlSi, AlSiCu, and AlCu are metals which include aluminum as a main ingredient. At the next step, the metal wiring is removed by etching for a desired pattern, in use of a technique, such as photo mechanical process and then the metal electrode is formed. As a method for etching removal of the aluminum film, it is desirable to use a wet etching method. If the wet etching method is used when the metal wiring is formed, the end of a metal electrode will be made into a tapered shape. Accordingly, good connection between the metal electrode and the magnetic resistance thin film will be obtained.

Figure 6C:
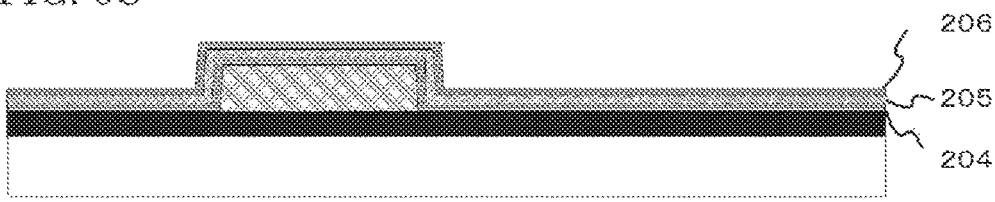

At the next step, in the process of FIG. 6C, a magnetic resistance thin film layer 204, an insulating film 205, and an exfoliation sacrifice film 206 are formed. First of all, a magnetic resistance thin film layer 204 is formed by using a PVD coating unit. Here, as the magnetic resistance thin film, an artificial lattice film is formed, in which a magnetic layer (second metal layer 204b) which consists of a Fe(x) Co(1−x) (0≤x≤0.3) layer and a non-magnetic layer (first metal layer 204a) which consists of a Cu layer are stacked one after the other. The magnetic layers which each consists of a Fe(x) Co(1−x) (0≤x≤0.3) layer become a GMR element. In this magnetic resistance thin film, a layered product which includes a magnetic layer and a non-magnetic layer forms one period. A lamination structure is formed which includes 20 periods of the layered product. The thickness of a magnetic layer is 11-18 Å and the thickness of a non-magnetic layer is 19-23 Å. It is to be noted that, the film thickness of the magnetic resistance thin film and the number of the layered products stacked are not restricted to those values.

The film thickness of the magnetic resistance thin film layer 204 is 200-2000 Å or so in general. As GMR elements, conventionally and publicly known Fe/Cr, Permalloy/Cu/Co/Cu, and Co/Cu can be used here. Moreover, as a magnetic resistance thin film, nickel-Fe, nickel-Co, and the like can be used, for example. At the next step, an insulating film 205 is formed. It is to be noted that, a protective film 207 and an insulating film 205 need to be made from the same material. Here, it is preferable to form a silicon nitride film as an insulating film 205, by using a PECVD (Plasma-Enhanced Chemical Vapor Deposition) coating unit.

Here, as for the conditions at the time of forming a silicon nitride film, it is desirable to set up the conditions with a timely response so that the film stress may become small. In more precise terms, the film formation conditions need to be adjusted so that the film stress will become no larger than $\pm 1.0 \times 10^8$ N/m². Furthermore, the insulating film is formed at 0.1 μm in film thickness. Here, the insulating film is required to have a film thickness large enough to ensure the electrical insulation between the exfoliation sacrifice film and the magnetic resistance thin film layer. Accordingly, the insulating film needs to be formed at most thinly. Furthermore, there are not any particular restrictions on the materials which are to be employed for forming the insulating film 205, as far as those materials can be used for forming an insulating film in the present technical field.

At the next step, an exfoliation sacrifice film 206 is formed by using a PVD coating unit. Here, as the formation method of the exfoliation sacrifice film, the same technique that is employed in the formation of the magnetic resistance thin film layer 204 is preferably used. It is to be noted that, as for the material of the exfoliation sacrifice film, at least one of the upper most layer 206U and the lower most layer 206L, which constitute the exfoliation sacrifice film, needs to be made from the same material with that of the upper most layer of the magnetic resistance thin film layer. In the present embodiment, a magnetic layer of 50 Å or so in film thickness, which consists of a Fe(x) Co(1−x) (0≤x≤0.3) layer and constitutes the upper most layer of the magnetic resistance thin film layer, is formed as an exfoliation sacrifice film.

Here, there are not any particular restrictions on the film thickness of the exfoliation sacrifice film, as far as the thickness can ensure the formation of a metal film. In the GMR element which consists of an artificial lattice film, one layer is formed on an 11 Å level in film thickness. Films of 11 Å or more in film thickness need to be formed. Although films of more thickness may be allowed to be formed, the productivity will become lower, due to the increase in time for forming and etch removing of the metal film. It is preferable to set the film thickness of the exfoliation sacrifice film below or equivalent to that of the magnetic resistance thin film, owing to the cost up of the film formation.

In the present invention, it is obvious that the magnetic resistance thin film used for the exfoliation sacrifice film does not need to have a magneto resistive effect. Therefore, the exfoliation sacrifice films are not limited in the film thickness and the number of layers stacked. In the present invention, although the exfoliation sacrifice film was formed to be insulated electrically from an integrated circuit, it is allowed to form the exfoliation sacrifice film to be at a fixed potential.

Figure 6D:

At the next step, in the process of FIG. 6D, the magnetic resistance thin film layer 204, the insulating film 205, and the exfoliation sacrifice film 206 are selectively removed by etching for a desired pattern, by using a technique, such as photo engraving process. Here, as the etching removing method, an IBE (Ion Beam Etching) unit is used, for example. It is to be noted that, after all layers of the magnetic resistance thin film layer 204, the insulating film 205, and the exfoliation sacrifice film 206 are formed, they are removed by etching at once. Accordingly, the exfoliation sacrifice film can be formed comparatively easily, without increasing the process in the conventional photo engraving process and the etching removal process.

Figure 6E:
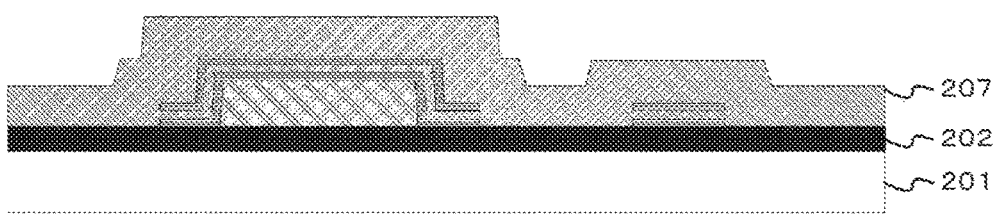

At the next step, in the process of FIG. 6E, a protective film 207 for protecting the surface of a sensor device module is formed. Here, the protective film 207 and the insulating film 205 need to be made from the same material. It is to be noted that, as the protective film 207, it is preferable to form a silicon nitride film by using a PECVD (Plasma-Enhanced Chemical Vapor Deposition) coating unit. Here, as for the conditions at the time of forming a silicon nitride film, it is desirable to set up the conditions with a timely response so that the film stress may become small. In more precise terms, the film formation conditions need to be adjusted so that the film stress will become no larger than $\pm 1.0 \times 10^8$ N/m².

Moreover, as for the film thickness of the protective film, 0.75 μm or so is preferred. Here, the film thickness of the protective film needs to be large enough to protect an integrated circuit from physical shocks. Furthermore, if the protective film becomes larger in film thickness, the internal stress of the protective film will increase. The time for forming the protective film and the time for etching removal for exposing a bonding pad will become longer. As the productivity becomes lower and the cost goes up, protective films 207 of 0.7 μm-1.5 μm in film thickness are preferable formed. There are not any particular restrictions on the material which is to be used for forming the protective film 207, as far as the material can be used for forming a protective film in the present technical field.

At the next step, after a protective film 207 is formed, heat treatment is preferably carried out, in order to stabilize the characteristics of the magnetic resistance thin film layer 204. The heat treatment is in general carried out at a temperature larger than the upper limit temperature of the usage environment. Here, the bonding pad part 102 (refer to FIG. 1) is removed by etching, in use of a photo engraving technique and a RIE (Reactive Ion Etching) unit. It is to be noted that, in addition to the silicon nitride film, a polyimide film may be formed as a protective film on the protective film 207.

As for the polyimide film, there are not any particular restrictions on the material, as far as the material can be used for forming a polyimide film in the present technical field. The GMR element, which consists of an artificial lattice film, will show a steep decline in the magnetic property, if the element is heated up to 300° C. or more. Thereby, as is publicly and conventionally known, it is necessary to employ a polyimide film which can be hardened below 300° C.

In this way, a sensor device module which is provided with the exfoliation sacrifice film on the magnetic resistance thin film layer is completed. The magnetic sensor device module according to the present embodiment is a sensor device module which includes in a contact part the exfoliation sacrifice film formed on the magnetic resistance thin film layer and is excellent in the resistance to the environment. The metal electrode and the magnetic resistance thin film layer where the stress concentrates are electrically connected in the contact part.

Exfoliation in the present sensor structure is produced at upper layers of the insulating film 205 by having an exfoliation sacrifice film, when stress is applied which is large enough cause the exfoliation of the protective film 207 and the magnetic resistance thin film layer 204 in a conventional structure. Accordingly, the magnetic resistance thin film layer 204 is protected in the present sensor structure. In particular, the present sensor structure is effective at the contact part where the stress concentrates. Moreover, there is a case where cracks are generated in the protective film 207 of the contact part by the stress of the mold resin at the heat cycle endurance test, which is performed after the sensor device module is mounted in a mold package. As a secondary effect of the present embodiment, cracks which are generated in the protective film can stop at the exfoliation sacrifice film 206, by having an exfoliation sacrifice film.

Further, the stress is released and then the magnetic resistance thin film can be protected, because cracks are generated in the protective film. In addition to that, as a secondary effect, the stress is absorbed by the deformation of a metal film which constitutes the exfoliation sacrifice film, when stress is applied. Furthermore, the stress applied to the magnetic resistance thin film layer is released, because the exfoliation is generated in the sacrifice layer, when stress is applied which is large enough to cause the exfoliation. By these effects, the magnetic resistance thin film layer, which consists of an artificial lattice film and is comparatively vulnerable to the change in the magnetic property due to the stress, can be easily restrained in the change of property.

Embodiment 2

Embodiment 2 also relates to a sensor device module in which a magnetic sensor is formed on the same plane as an integrated circuit is to be formed. Although the protective film and the insulating film were made from the same material in Embodiment 1, the protective film and the insulating film are made from different materials in Embodiment 2. According to the present embodiment, it is possible to select different materials for an insulating film 205 and a protective film 207. A magnetic sensor device module 100 includes an integrated circuit 101, a bonding pad part 102, and a sensor field 103 (refer to FIG. 1).

A magnetic sensor element (magnetic resistance thin film layer) is formed in the sensor field 103. From the bonding pad part 102, voltage and others for driving the device (integrated circuit 101) are supplied. A magnetic sensor device module 100 is provided with two sensor fields 103. Four contact parts 104 are formed in each of the sensor fields 103. The magnetic sensor element responds to a magnetic field, and the integrated circuit 101 reads out the detected magnetic field as an electric signal (sensor signal). The bonding pad part 102 is provided in order to read the sensor signal and output it to the outside.

Figure 7:
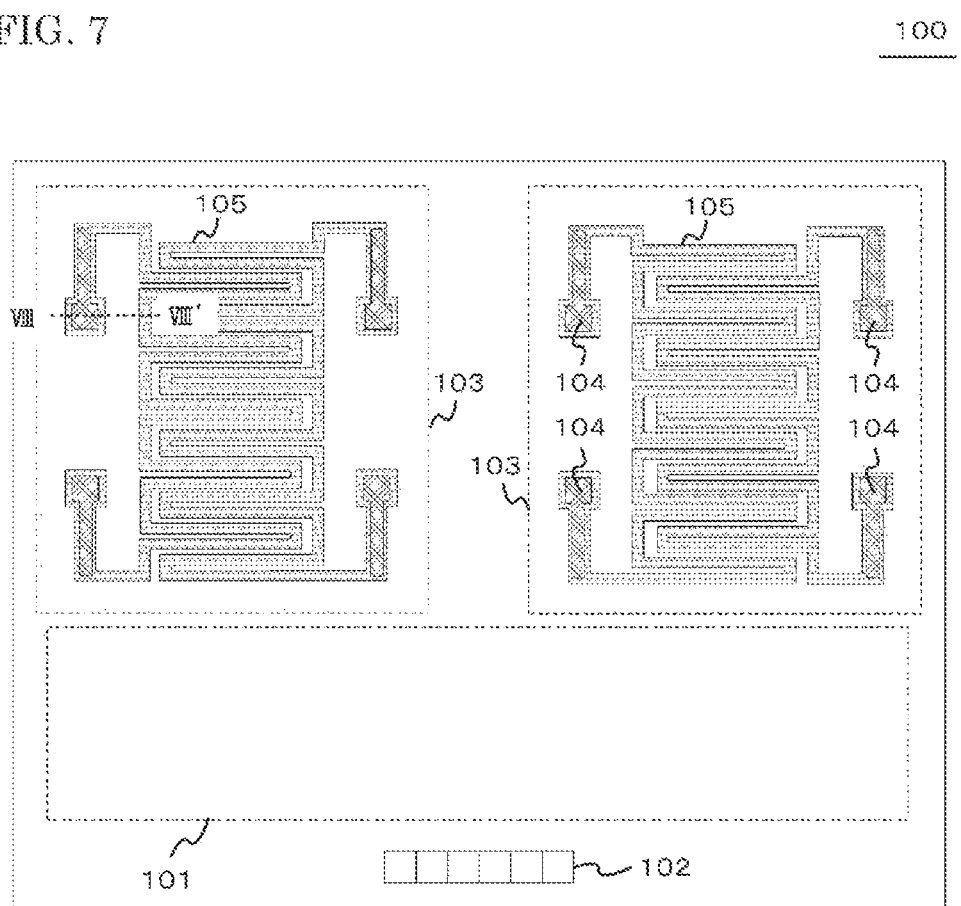
FIG. 7 is a top view for showing the magnetic sensor device module in accordance with Embodiment 2 of the present invention.

FIG. 7 shows a top view of the magnetic sensor device chip in accordance with the present embodiment. Contact parts 104 and a sensor element 105 are formed in a sensor field 103 of the magnetic sensor device module 100. The integrated circuit 101 receives a signal from the sensor element 105 which responded to a magnetic field, performs predetermined operation processing, and reads it out as an electric signal (sensor signal). The bonding pad part 102 is provided in order to supply voltage and the like for driving the device (integrated circuit 101), and read the signal and output it to the outside. The sensor element 105 (magnetic resistance thin film layer 204) of the sensor field 103 and metal electrodes of the integrated circuit 101 are electrically connected at the contact part 104 of the sensor field 103. The integrated circuit 101 is arranged in an area different from the area where the sensor field 103 is arranged. The sensor element 105 is covered with a protective film, and has a predetermined pattern.

Figure 8:
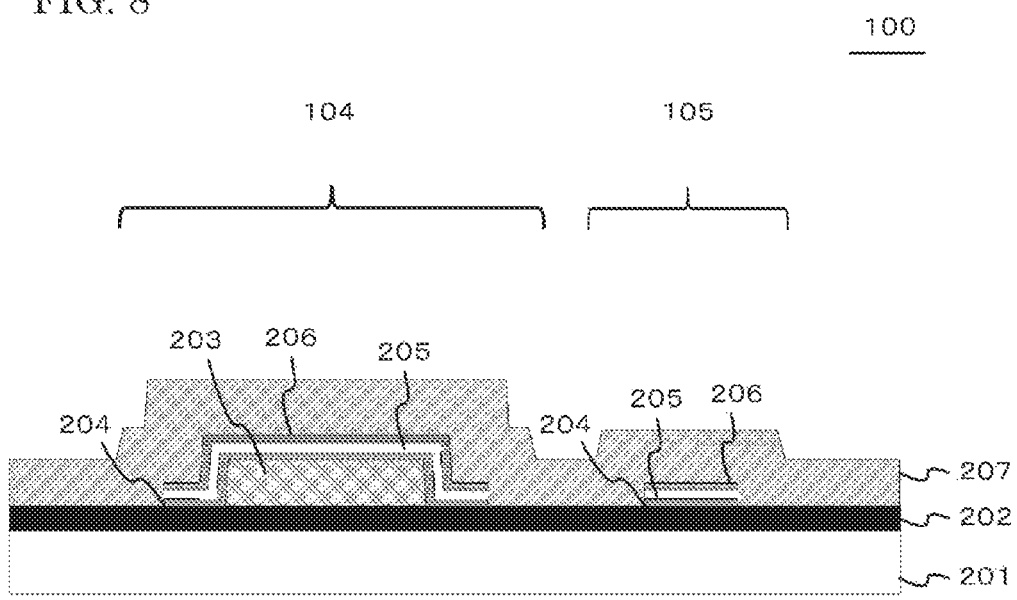
FIG. 8 is a sectional view for showing the magnetic sensor device module in accordance with Embodiment 2 of the present invention.

FIG. 8 shows a fragmentary and sectional view of the sensor field 103 in the magnetic sensor device module 100 (refer to the contact part 104 and the sensor element 105 shown in FIG. 7). The magnetic sensor device module 100 according to the present embodiment includes a substrate 201, an insulating film 202, a metal electrode 203, a magnetic resistance thin film layer 204, an insulating film 205, and an exfoliation sacrifice film 206 and a protective film 207. The integrated circuit 101 is formed on the substrate 201. The insulating film 202 serves as a foundation layer of the magnetic resistance thin film layer 204. The metal electrode 203 is formed on the insulating film 202, and connects the magnetic resistance thin film layer 204 and the integrated circuit 101.

At the contact part 104, the magnetic resistance thin film layer 204, the insulating film 205, and the exfoliation sacrifice film 206 have covered the metal electrode 203. Furthermore, on the insulating film 202, there is provided a sensor element 105 which includes a magnetic resistance thin film layer 204, an insulating film 205, and an exfoliation sacrifice film 206. The magnetic resistance thin film layer 204, the insulating film 205, and the exfoliation sacrifice film 206 are formed in the pattern of a desired shape. The magnetic resistance thin film layer 204, the insulating film 205, and the exfoliation sacrifice film 206 are covered with the protective film 207. The magnetic resistance thin film layer 204 and the metal electrode 203 are electrically connected at the contact part 104.

It is to be noted that, although the magnetic resistance thin film layer 204, the insulating film 205, and the exfoliation sacrifice film 206 are formed in the same shape in the sectional drawing, the magnetic resistance thin film layer 204, the insulating film 205, and the exfoliation sacrifice film 206 need not to be formed in the same shape. The insulating film 205 and the exfoliation sacrifice film 206 may be formed so as to cover the magnetic resistance thin film layer 204. Although the sensor element 105 and the contact part 104 are provided with an exfoliation sacrifice film 206, either the sensor element or the contact part may be provided with an exfoliation sacrifice film. Although the insulating film and the exfoliation sacrifice film are each formed of a single layer here, a period consisting of an insulating film and an exfoliation sacrifice film may be stacked in plural repeatedly.

Figure 9:
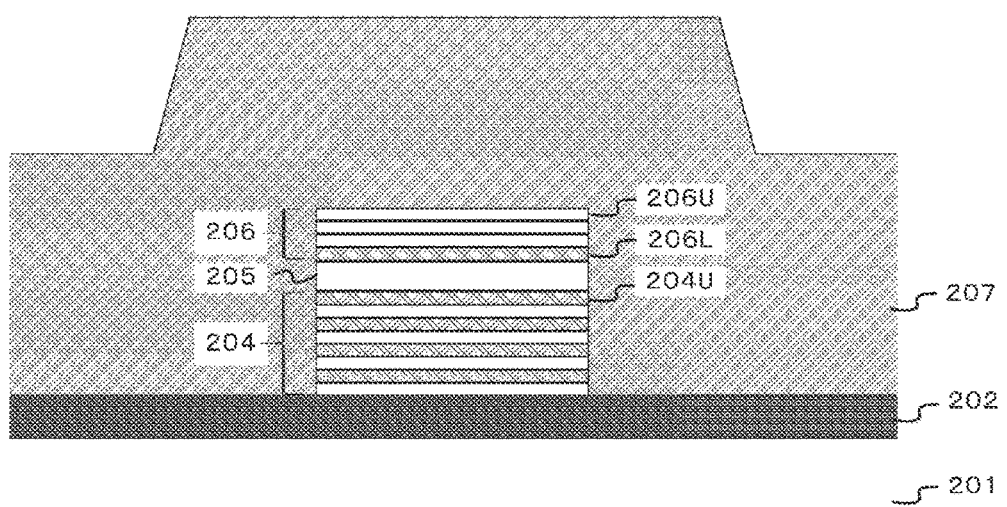
FIG. 9 is a first detailed sectional view for showing the magnetic sensor device module in accordance with Embodiment 1 of the present invention.
Figure 10:
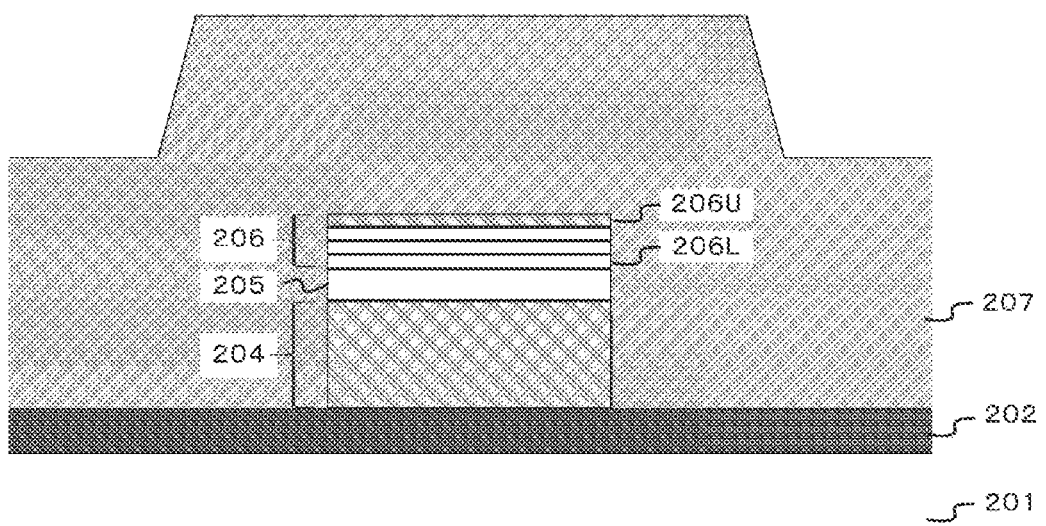
FIG. 10 is a second detailed sectional view for showing the magnetic sensor device module in accordance with Embodiment 1 of the present invention.

FIG. 9 is a first sectional view which shows the details of a sensor element. The magnetic resistance thin film layer 204 consists of first metal layers 204a and second metal layers 204b, which are each stacked one after the other. In the drawing, the magnetic resistance thin film layer 204 is formed of four layers of the first metal layer 204a and four layers of the second metal layer 204b. The exfoliation sacrifice film 206 includes four layers of a film in the drawing. FIG. 10 is a second sectional view which shows the details of the sensor element. The magnetic resistance thin film layer 204 consists of a single metal layer. The exfoliation sacrifice film 206 consists of four layers of the film in the drawing. In the present embodiment, contact films denote the magnetic resistance thin film layer 204 and the insulating film 205 (hereafter referred to as IN3), the insulating film 205 and the exfoliation sacrifice film 206 (hereafter referred to as IN2), and the exfoliation sacrifice film 206 and protective film 207 (hereafter referred to as IN1). In the present structure, the protective film 207 and the insulating film 205 are made from different materials. The exfoliation sacrifice film 206 includes the upper most layer 206U and the lower most layer 206L. At least the lower most layer 206L is to be made from the same material as the upper most layer 204U of the magnetic resistance thin film layer (layered metal thin film).

It is to be noted that, when the upper most layer 206 U and the lower most layer 206L of the exfoliation sacrifice film 206 is made from the same material with that of the upper most layer 204U of the layered metal thin film 204, the contact surfaces of IN2 and IN3 become the same in composition. Accordingly, those contact surfaces are equivalent in adhesion property. When stress is applied from a protective film to the contact surfaces, the stress to lower layers is reduced by the change in shape of the exfoliation sacrifice film, for which a metal film is employed. Furthermore, when the stress, which is large enough to cause the exfoliation of the protective film, is applied to the protective film, an exfoliation is produced at IN1 or IN2. In this case, the exfoliation is produced at the upper layers of the insulating film 205. Thereby the magnetic resistance thin film layer 204 can be protected.

It is to be noted that, when the lower most layer of the exfoliation sacrifice film is made from the same material with that of the upper most layer of the layered metal thin film, the contact surfaces of IN2 and IN3 become the same in composition. Accordingly, those contact surfaces are equivalent in adhesion property. When stress is applied from a protective film to the contact surfaces, the stress to lower layers is reduced by the change in shape of the exfoliation sacrifice film, for which a metal film is employed. Furthermore, when the stress, which is large enough to cause the exfoliation of the protective film, is applied to the protective film, an exfoliation is produced at IN1 or IN2. In this case, the exfoliation is produced at the upper layers of the insulating film 205. Thereby the magnetic resistance thin film layer 204 is protected.

In the next paragraphs, descriptions are made on the manufacturing method of the magnetic sensor device module of the present embodiment with reference to drawings. FIGS. 11A to 11E are sectional views for showing the process of manufacturing the magnetic sensor device module according to Embodiment 1 of the present invention (refer to the sectional view of FIG. 8). Hereinafter, the process which was employed in the present embodiment is described step by step. The detailed configurations of the bonding pad and the integrated circuit, which are irrelevant to the features of the present invention, are omitted.

Figure 11A:
FIGS. 11A to 11E are sectional views for showing Processes A to E of the magnetic sensor device module in accordance with Embodiment 2 of the present invention.

At first, in the process of FIG. 11A, an insulating film 202 which serves as the foundation layer of a magnetic resistance thin film layer is prepared. Here, it is preferable to form a silicon nitride film as an insulating film 202, by using a PECVD (Plasma-Enhanced Chemical Vapor Deposition) coating unit. Here, it is desirable to set up the conditions at the time of forming silicon nitride films with a timely response so that the film stress may become small. In more precise terms, the film formation conditions may be adjusted so that film stress may become no larger than $\pm 1.0 \times 10^8$ N/m². Moreover, as for the film thickness of the insulating film, 0.5 μm or so is preferred from the viewpoint of a magnetic resistance film formation process. Furthermore, there are not any particular restrictions on the material which is to be used for forming the insulating film 202, as far as the material can be used for forming an insulating film in the present technical field.

Figure 11B:
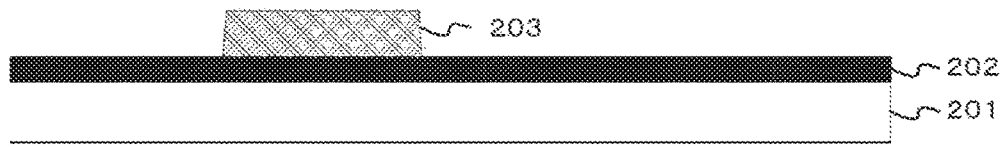

At the next step, in the process of FIG. 11B, metallic wiring which is to be used as a metal electrode 203 is formed. Here, as the metallic wiring, it is preferable to form an aluminum film, by using a PVD (Physical Vapor Deposition) coating unit. Moreover, as for the film thickness of the aluminum film, 1 μm or so is preferred. The film thickness of the aluminum film may be set at a film thickness which has sufficient function. The film thickness which has sufficient function means a case where the film can ensure the reliability, even if an electric and physical stress is applied to the metallic wiring. Here, a conventionally and publicly known material can be used as the metal electrode 203.

For example, AlSi, AlSiCu, AlCu, Al, Cu and the like can be used as the material of metal wiring. AlSi, AlSiCu, and AlCu are metals which include aluminum as the main ingredient. At the next step, the metal wiring is removed by etching for a desired pattern by using a technique, such as a photo mechanical process and then the metal electrode is formed. As a method for etching removal of the aluminum film, it is desirable to use a wet etching method. If the wet etching method is used when the metal wiring is formed, the end of the metal electrode will be made into a tapered shape. Accordingly, the good connection between the metal electrode and the magnetic resistance thin film will be obtained.

Figure 11C:
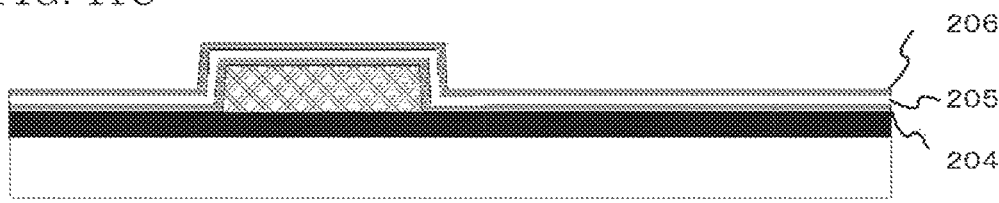

At the next step, in the process of FIG. 11C, a magnetic resistance thin film layer 204, an insulating film 205, and an exfoliation sacrifice film 206 are formed. First of all, a magnetic resistance thin film layer 204 is formed by using a PVD coating unit. Here, as the magnetic resistance thin film, an artificial lattice film is formed, where a magnetic layer (second metal layer) which consists of a Fe(x) Co(1−x) (0≤x≤0.3) layer and a non-magnetic layer (first metal layer) which consists of a Cu layer are stacked one after the other. The magnetic layer which consists of Fe(x) Co(1−x) (0≤x≤0.3) layers is a GMR element. In this magnetic resistance thin film, the layered product of a magnetic layer and a non-magnetic layer forms one period. A lamination structure is formed which includes 20 periods of the layered product. The thickness of a magnetic layer is 11-18 Å and the thickness of a non-magnetic layer is 19-23 Å. It is to be noted that, the film thickness of the magnetic resistance thin film and the number of laminations are not restricted to those values.

The film thickness of the magnetic resistance thin film layer 204 is generally in the range of 200-2000 Å or so. As GMR elements, conventionally and publicly known Fe/Cr, Permalloy/Cu/Co/Cu, and Co/Cu can be used here. Moreover, as a magnetic resistance thin film, Ni—Fe, Ni—Co, and the like can be used, for example. At the next step, an insulating film 205 is formed. It is to be noted that, the same material is employed for a protective film 207 and an insulating film 205. Here, it is preferable to form a silicon nitride film as an insulating film 205, by using a PECVD (Plasma-Enhanced Chemical Vapor Deposition) coating unit.

Here, as for the conditions at the time of forming a silicon nitride film, it is desirable to set up the conditions with a timely response so that the film stress may become small. In more precise terms, the film formation conditions need to be adjusted so that the film stress will become no larger than $\pm 1.0 \times 10^8$ N/m². Furthermore, the insulating film will be formed with film thickness of 0.1 µm. Here, the insulating film is required to have a film thickness large enough to ensure the electrical insulation between the exfoliation sacrifice film and the magnetic resistance thin film layer. Accordingly, the insulating film needs to be formed at most thinly. Furthermore, there are not any particular restrictions on the material which is to be employed for forming the insulating film 205, as far as the material can be used for forming an insulating film in the present technical field.

At the next step, an exfoliation sacrifice film 206 is formed by using a PVD coating unit. Here, as the formation method of the exfoliation sacrifice film, the same technique that is employed in the formation of the magnetic resistance thin film layer 204 is preferably used. The exfoliation sacrifice film includes the upper most layer and the lower most layer. It is to be noted that, as for the material of the exfoliation sacrifice film, at least the lower most layer needs to be made from the same material as the upper most layer of the magnetic resistance thin film layer. In the present embodiment, a magnetic layer, which constitutes the upper most layer of the magnetic resistance thin film layer and consists of a Fe(x) Co(1−x) (0≤x≤0.3) layer, is formed as the lower most layer of the exfoliation sacrifice film. A lamination structure is formed which includes 20 periods of the layered product, where one period includes the layered product of a magnetic layer and a non-magnetic layer.

Here, as for the film thickness of the exfoliation sacrifice film, there are not any particular restrictions on the film thickness, as far as the thickness can ensure the formation of a metal film. In the GMR element consisting of an artificial lattice film, one layer is formed on an 11 Å level in film thickness. Films of 11 Å or more in film thickness need to be formed. Although films of more thickness may be allowed to be formed, the productivity will become lower, due to the increase in time for forming and etch removing of the metal film. It is preferable to set the film thickness of the exfoliation sacrifice film below or equivalent to that of the magnetic resistance thin film, owing to the cost up of the film formation.

In the present invention, it is obvious that the magnetic resistance thin film used for the exfoliation sacrifice film does not need to have a magneto resistive effect. Therefore, the exfoliation sacrifice films are not limited in the film thickness and the number of layers stacked. In the present invention, although the exfoliation sacrifice film was formed to be insulated electrically from an integrated circuit, it is allowed to form the exfoliation sacrifice film to be at a fixed potential.

Figure 11D:
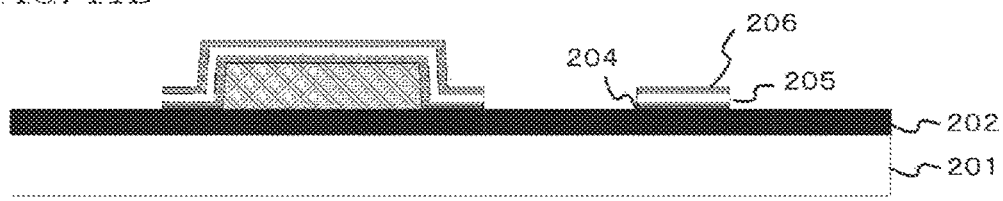

At the next step, in the process of FIG. 11D, the magnetic resistance thin film layer 204, the insulating film 205, and the exfoliation sacrifice film 206 are selectively removed by etching for a desired pattern by using a technique, such as the photo engraving process. Here, as the etching removal method, an IBE (Ion Beam Etching) unit is used, for example. It is to be noted that, after all layers of the magnetic resistance thin film layer 204, the insulating film 205, and the exfoliation sacrifice film 206 are formed, removal by etching will be carried out at once. Accordingly, the exfoliation sacrifice film can be formed comparatively easily, without increasing the process in the conventional photo engraving process and the etching removal process.

Figure 11E:
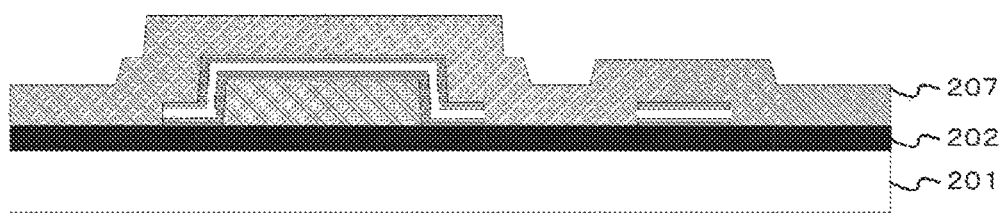

At the next step, in the process of FIG. 11E, a protective film 207 for protecting the surface of a sensor device module is formed. Here, the protective film 207 and the insulating film 205 need to be made from different materials. It is to be noted that, as the protective film 207, it is preferable to form a silicon nitride film by using a PECVD (Plasma-Enhanced Chemical Vapor Deposition) coating unit. Here, as for the conditions at the time of forming a silicon nitride film, it is desirable to set up the conditions with a timely response so that the film stress may become small. In more precise terms, the film formation conditions need to be adjusted so that the film stress will become no larger than $\pm 1.0 \times 10^8$ N/m².

Moreover, as for the film thickness of the protective film, 0.75 µm or so is preferred. Here, the film thickness of the protective film needs to be large enough to protect an integrated circuit from physical shocks. Furthermore, if the protective film becomes larger in film thickness, the internal stress of the protective film will increase. The time for forming the protective film and the time for etching removal for exposing a bonding pad will become long. As the productivity becomes lower and the cost goes up, protective films of 0.7 µm-1.5 µm in film thickness are preferable formed. Furthermore, there are not any particular restrictions on the material which is to be employed for forming the protective film 207, as far as the material can be used for forming a protective film in the present technical field.

At the next step, after a protective film 207 is formed, heat treatment is preferably carried out, in order to stabilize the characteristics of the magnetic resistance thin film layer 204. The heat treatment is in general carried out at a temperature larger than the upper limit temperature of the usage environment. Here, the bonding pad part 102 (refer to FIG. 1) is removed by etching, in use of a photo engraving technique and a RIE (Reactive Ion Etching) unit. It is to be noted that, in addition to the silicon nitride film, a polyimide film may be formed as a protective film on the protective film 207.

As for the polyimide film, there are not any particular restrictions on the material, as far as the material can be used for forming a polyimide film in the present technical field. The GMR element, which consists of an artificial lattice film, will show a steep decline in the magnetic property, if the element is heated up to 300° C. or more. Thereby, as is publicly and conventionally known, it is necessary to employ a polyimide film which can be hardened below 300° C.

In this way, a sensor device module which is provided with the exfoliation sacrifice film on the magnetic resistance thin film layer is completed. The magnetic sensor device module according to the present embodiment is a sensor device module which, in a contact part, includes the exfoliation sacrifice film formed on the magnetic resistance thin film layer and is excellent in the resistance to the environment. The metal electrode and the magnetic resistance thin film layer where the stress concentrates are electrically connected in the contact part.

Exfoliation in the present sensor structure is produced at upper layers of the insulating film 205 by having an exfoliation sacrifice film, when stress is applied which is large enough to cause the exfoliation of the protective film 207 and the magnetic resistance thin film layer 204 in a conventional structure. Accordingly, the magnetic resistance thin film layer 204 is protected in the present sensor structure. In particular, the present sensor structure is effective at the contact part where the stress concentrates. Moreover, there is a case where cracks are generated in the protective film 207 of the contact part by the stress of the mold resin at the heat cycle endurance test, which is performed after the sensor device module is mounted in a mold package. As a secondary effect of the present embodiment, cracks which are generated in the protective film can stop at the exfoliation sacrifice film 206, by having an exfoliation sacrifice film.

Further, the stress is released and then the magnetic resistance thin film can be protected, because cracks are generated in the protective film. In addition to that, as a secondary effect, the stress is absorbed by the deformation of a metal film which constitutes the exfoliation sacrifice film, when stress is applied. Furthermore, the stress applied to the magnetic resistance thin film layer is released, because the exfoliation is generated in the sacrifice layer, when stress is applied which is large enough to cause the exfoliation. By these effects, the magnetic resistance thin film layer, which consists of an artificial lattice film and is comparatively vulnerable to the change in the magnetic property due to the stress, can be easily restrained in the change of property.

Embodiment 3

Figure 12:
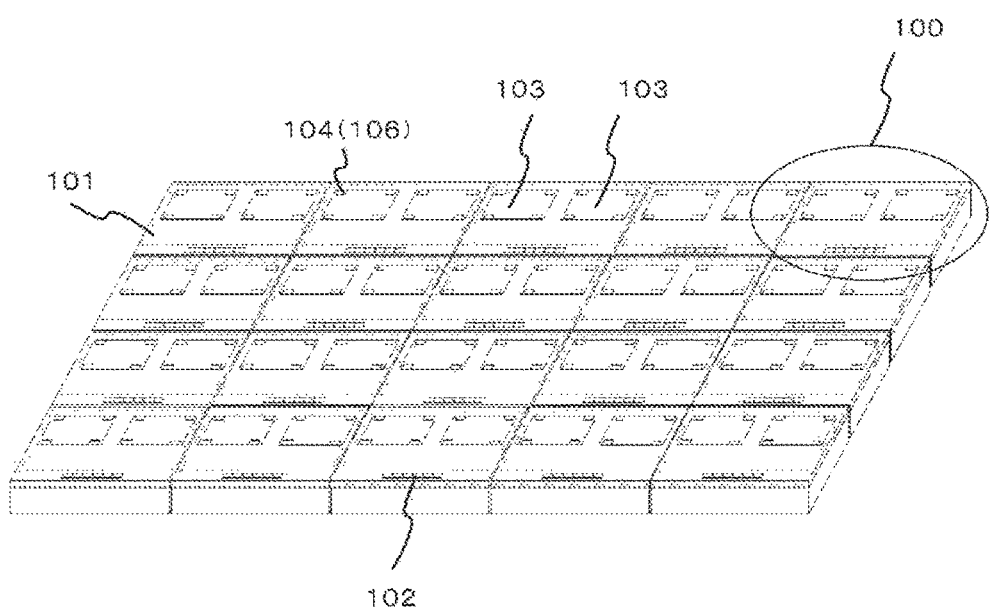
FIG. 12 is a bird's eye view for showing magnetic sensor device modules in accordance with Embodiments 3 and 4 of the present invention.

Embodiment 3 relates to a sensor device module in which an interlayer insulating film which consists of a flattening film is used for flattening a difference in level on the surface of the integrated circuit which performs predetermined arithmetic processing and then a magnetic resistance thin film is formed directly on the planarized surface of the integrated circuit. In the present embodiment, a protective film and an insulating film are made from the same material. FIG. 12 shows a magnetic sensor device module 100 in accordance with the present embodiment. The magnetic sensor device module 100 consists of an integrated circuit 101, a bonding pad part 102, and a sensor field 103. The sensor field 103 is formed on the planarized integrated circuit 101. From the bonding pad part 102, voltage and others for driving the device (integrated circuit 101) are supplied. The magnetic sensor device module 100 is provided with two sensor fields 103. Four contact holes 106 (contact parts 104) are formed in each of the sensor fields 103. A magnetic sensor element responds to a magnetic field, and the integrated circuit 101 reads out the detected magnetic field as an electric signal (sensor signal). The bonding pad part 102 is provided in order to read the sensor signal and output it to the outside. The contact part 104 is formed in the contact hole 106.

Figure 13:
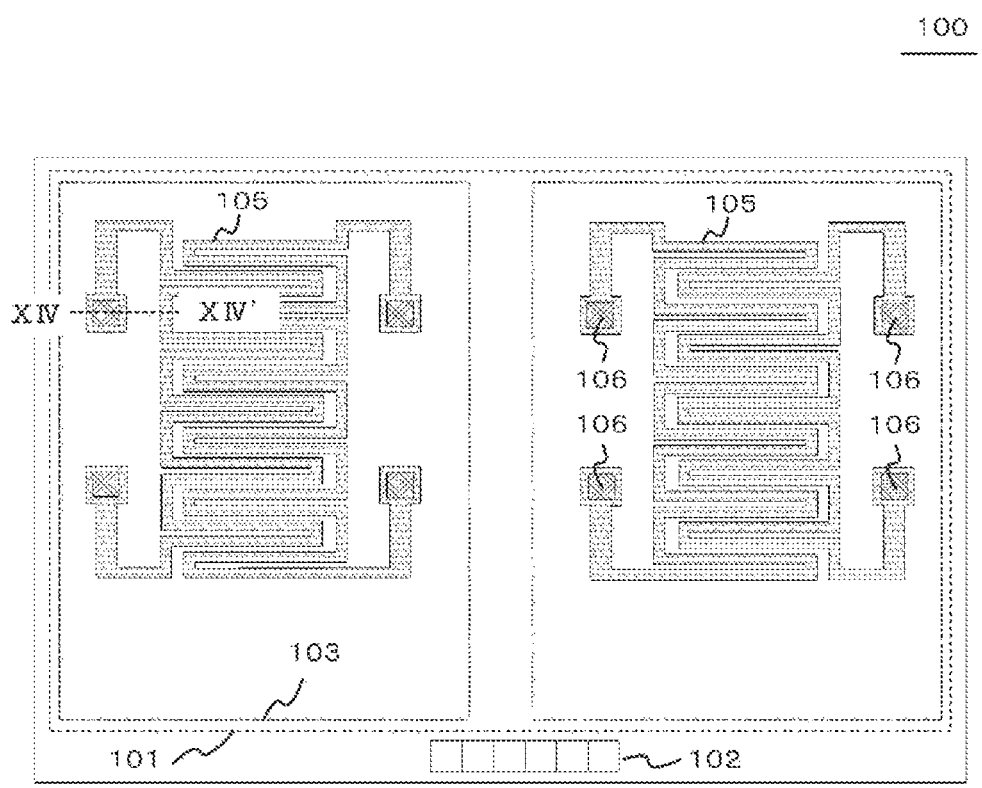
FIG. 13 is a top view for showing the magnetic sensor device module in accordance with Embodiment 3 of the present invention.

FIG. 13 shows a top view of the magnetic sensor device chip in accordance with the present embodiment. The sensor field 103 (magnetic resistance thin film) is formed directly on the integrated circuit 101. Contact holes 106 (contact parts 104) and the sensor element 105 are formed in the sensor field 103 of the magnetic sensor device module 100. The integrated circuit 101 receives a signal from the sensor element 105 which responded to a magnetic field, performs predetermined operation processing, and reads it out as an electric signal (sensor signal). The bonding pad part 102 is provided in order to supply voltage and the like for driving the device (integrated circuit 101), and read the signal and output it to the outside. The sensor element 105 (magnetic resistance thin film layer) of the sensor field 103 and metal electrodes of the integrated circuit 101 are electrically connected at the contact part 104 of the sensor field 103. The integrated circuit 101 is arranged in the same area as the sensor field 103 is arranged. The sensor element 105 is covered with a protective film, and has a predetermined pattern.

Figure 14:
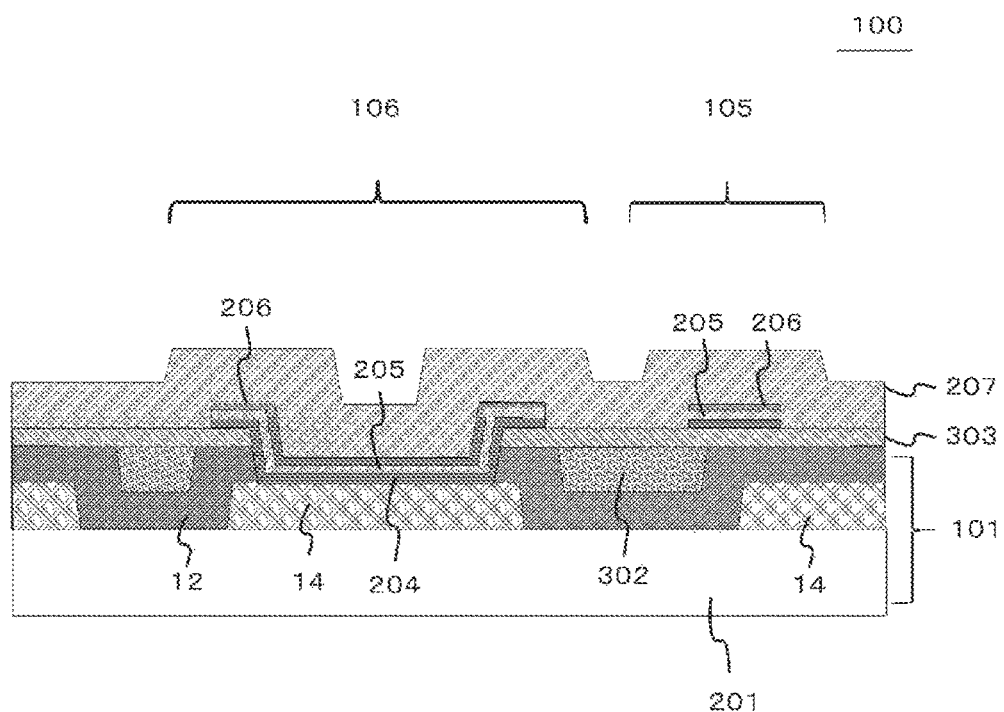
FIG. 14 is a sectional view for showing the magnetic sensor device module in accordance with Embodiment 3 of the present invention.

FIG. 14 shows a fragmentary and sectional view of the sensor field 103 in the magnetic sensor device module 100 (refer to the contact hole 106 and the sensor element 105 shown in FIG. 13). The magnetic sensor device module 100 according to the present embodiment includes an integrated circuit 101, a flattening film 302, and an insulating film 303. The flattening film 302 is provided to make flat a difference in level of the surface of integrated circuit 101. The insulating film 303 is formed on the planarized integrated circuit 101. A contact hole 106 penetrates a protective film 12, a flattening film 302, and an insulating film 303. The metal electrode 14 and the magnetic resistance thin film layer 204 are electrically connected via the contact hole 106. On the insulating film 303, there is provided a magnetic resistance thin film layer 204, an insulating film 205, an exfoliation sacrifice film 206, a sensor element 105, a contact hole 106, and a protective film 207.

The sensor element 105 is provided with an exfoliation sacrifice film 206. The magnetic resistance thin film layer 204, the insulating film 205, and the exfoliation sacrifice film 206 are formed in the pattern of a desired shape. The protective film 207 is provided to cover the magnetic resistance thin film layer 204, the insulating film 205, and the exfoliation sacrifice film 206. In the drawing, the flattening film 302 is formed only in the concave portion of the surface difference in level of the integrated circuit. The flattening film 302 may be formed so as to cover the whole surface of the integrated circuit 101. It is to be noted that, the metal electrode 14 and the magnetic resistance thin film layer 204 are electrically connected via the contact hole 106 which penetrates the protective film 12, the flattening film 302, and the insulating film 303.

It is to be noted that, although the magnetic resistance thin film layer 204, the insulating film 205, and the exfoliation sacrifice film 206 are formed in the same shape in the sectional drawing, the magnetic resistance thin film layer 204, the insulating film 205, and the exfoliation sacrifice film 206 need not to be formed in the same shape. The insulating film 205 and the exfoliation sacrifice film 206 may be formed so as to cover the magnetic resistance thin film layer 204. Although the sensor element 105 and the contact hole 106 are provided with an exfoliation sacrifice film 206, either the sensor element 105 or the contact hole 106 may be provided with an exfoliation sacrifice film 206. Although the insulating film 205 and the exfoliation sacrifice film 206 are each formed of a single layer here, a period consisting of an insulating film and an exfoliation sacrifice film may be stacked in plural repeatedly.

In the next paragraphs, descriptions are made on the manufacturing method of the magnetic sensor device module of the present embodiment with reference to drawings. FIGS. 15 to 20 are sectional views for showing the processes of manufacturing the magnetic sensor device module according to Embodiment 3 of the present invention (refer to the sectional view of FIG. 14). Hereinafter, the process which was employed in the present embodiment is described step by step. The detailed configurations of the bonding pad and the integrated circuit, which are irrelevant to the features of the present invention, are omitted.

Figure 15:
FIG. 15 is a sectional view for showing Process A of the magnetic sensor device module in accordance with Embodiment 3 of the present invention.

At first, in the process of FIG. 15, a flattening film 302 which makes flat the surface difference in level of the integrated circuit 101 is formed by using a spin coat unit. It is to be noted that, as the flattening film 302, it is desirable to employ SOG (Spin On Glass) which is excellent in the embeddedness of a concave portion on the surface of the integrated circuit 101 and in addition high in film hardness.

Here, there are not any particular restrictions on the material which is to be employed for forming the flattening film, as far as the material can be used for forming a flattening film in the present technical field. The flattening film 302 can be formed by carrying out the heat treatment for hardening the material, after a difference in level on the surface of the integrated circuit 101 is made flat by employing a planarization material. The conditions of the heat treatment for hardening depend on the kind of the material for planarization employed. It is allowed to set up the conditions with a timely response, taking into account the kind of the material for planarization.

Figure 16:
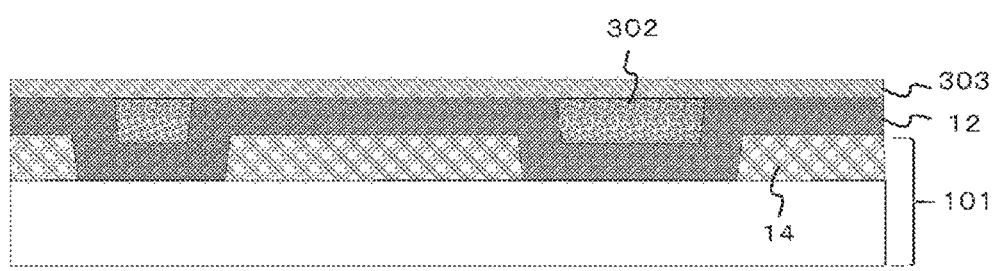
FIG. 16 is a sectional view for showing Process B of the magnetic sensor device module in accordance with Embodiment 3 of the present invention.

At the next step, in the process of FIG. 16, an insulating film 303 which serves as the foundation layer of a magnetic resistance thin film layer is formed. Here, it is preferable to form a silicon nitride film as an insulating film 303, by using a PECVD (Plasma-Enhanced Chemical Vapor Deposition) coating unit. Here, it is desirable to set up the conditions at the time of forming silicon nitride films with a timely response so that the film stress may become small. In more precise terms, the film formation conditions may be adjusted so that film stress may become no larger than $\pm 1.0 \times 10^8$ $N/m^2$.

Moreover, as for the film thickness of the insulating film 303, 0.5 μm or so is preferred from the viewpoint of a magnetic resistance film formation process. It is to be noted that, there are not any particular restrictions on the film thickness of the insulating film, as far as the film thickness is large enough to ensure the electrical insulation between the exfoliation sacrifice film and the magnetic resistance thin film layer. Furthermore, there are not any particular restrictions on the material which is to be used for forming the insulating film, as far as the material can be used for forming an insulating film in the present technical field.

Figure 17:
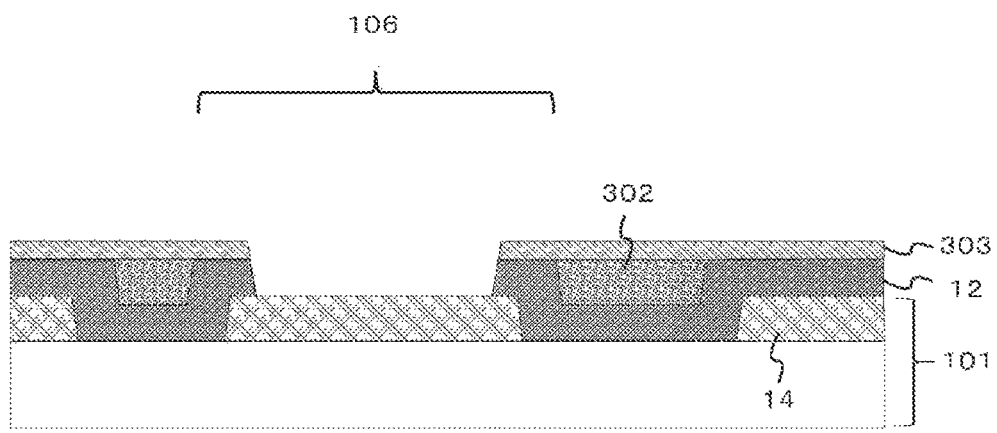
FIG. 17 is a sectional view for showing Process C of the magnetic sensor device module in accordance with Embodiment 3 of the present invention.

At the next step, in the process of FIG. 17, a contact hole 106 for electrically connecting the magnetic resistance thin film with the integrated circuit 101 is formed. For example, a portion of the integrated circuit 101 is opened, using a technique, such as a photo engraving process. The protective film 12, the flattening film 302, and the insulating film 303 are selectively removed by etching so that the metal electrode 14 may be exposed, and then a contact hole 106 is formed. It is to be noted that, as for the etching removing method, a RIE (Reactive Ion Etching) unit is preferably used to remove films by etching.

Figure 18:
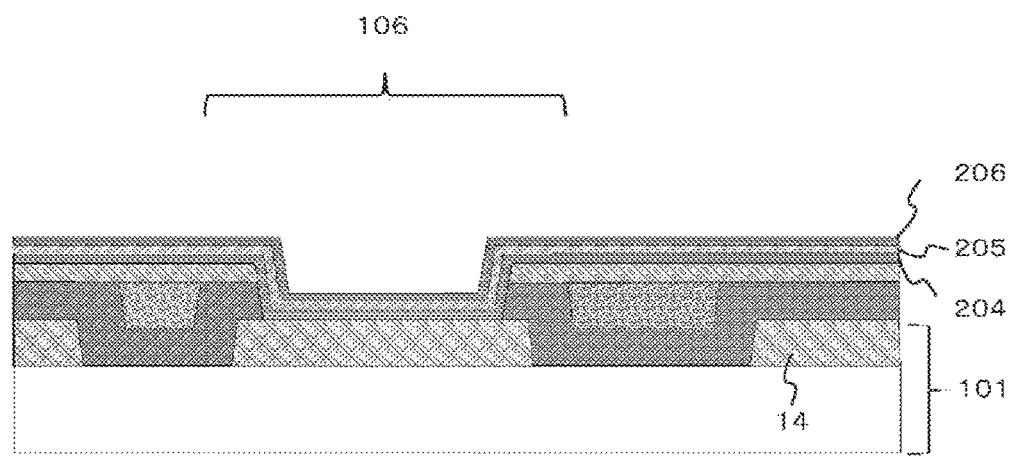
FIG. 18 is a sectional view for showing Process D of the magnetic sensor device module in accordance with Embodiment 3 of the present invention.
Figure 19:
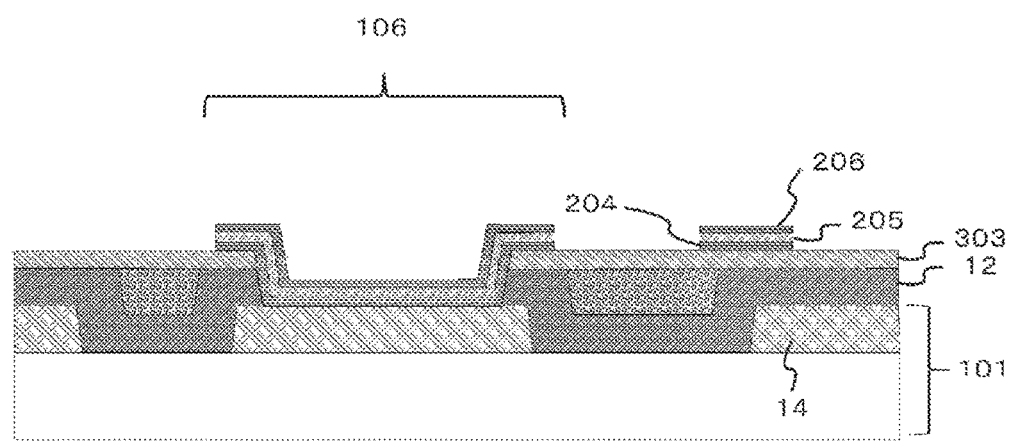
FIG. 19 is a sectional view for showing Process E of the magnetic sensor device module in accordance with Embodiment 3 of the present invention.
Figure 20:
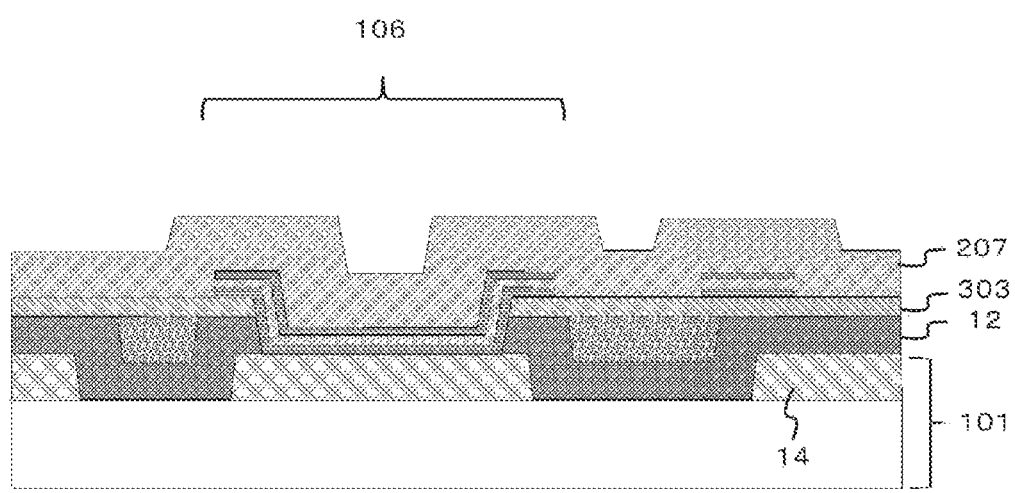
FIG. 20 is a sectional view for showing Process F of the magnetic sensor device module in accordance with Embodiment 3 of the present invention.

As for the process of FIG. 18, the process of FIG. 19, and the process of FIG. 20, explanations are the same as the process of FIG. 6C, the process of FIG. 6D, and the process of FIG. 6E of Embodiment 1, and then detailed descriptions are omitted. In this way, a sensor device module which is provided with the exfoliation sacrifice film on the magnetic resistance thin film layer is completed. The magnetic sensor device module according to the present embodiment is a sensor device module which includes, in a contact part, the exfoliation sacrifice film formed on the magnetic resistance thin film layer and is excellent in the resistance to the environment. The metal electrode and the magnetic resistance thin film layer where stress concentrates are electrically connected in the contact part.

In the present sensor structure, exfoliation is produced at upper layers of the insulating film 205 by having an exfoliation sacrifice film, when stress is applied which is large enough to cause the exfoliation of the protective film 207 and the magnetic resistance thin film layer 204 in a conventional structure. Accordingly, the magnetic resistance thin film layer 204 is protected in the present sensor structure. In particular, the present sensor structure is effective at the contact part where the stress concentrates. Moreover, there is a case where cracks are generated in the protective film 207 of the contact part by the stress of the mold resin at the heat cycle endurance test, which is performed after the sensor device module is mounted in a mold package. As a secondary effect of the present embodiment, cracks which are generated in the protective film can stop at the exfoliation sacrifice film 206, by having an exfoliation sacrifice film.

Further, the stress is released and then the magnetic resistance thin film can be protected, because cracks are generated in the protective film. In addition to that, as a secondary effect, the stress is absorbed by the deformation of a metal film which constitutes the exfoliation sacrifice film, when stress is applied. Furthermore, the stress applied to the magnetic resistance thin film layer is released, because the exfoliation is generated in the sacrifice layer, when stress is applied which is large enough to cause the exfoliation. By these effects, the magnetic resistance thin film layer, which consists of an artificial lattice film and is comparatively vulnerable to the change in the magnetic property due to the stress, can be easily restrained in the change of property.

Embodiment 4

Embodiment 4 relates to a sensor device module in which an interlayer insulating film which consists of a flattening film is used for flattening a difference in level on the surface of the integrated circuit which performs predetermined arithmetic processing and then a magnetic resistance thin film is formed directly on the planarized surface of the integrated circuit. Although the protective film and the insulating film are made from the same material in Embodiment 3, the protective film and the insulating film are made from different materials in Embodiment 4. According to the present embodiment, it is possible to select different materials for the insulating film 205 and the protective film 207.

A magnetic sensor device module 100 in accordance with the present embodiment consists of an integrated circuit 101, a bonding pad part 102, and a sensor field 103 (refer to FIG. 12). The sensor field 103 is formed on the planarized integrated circuit 101. From the bonding pad part 102, voltage and others for driving the device (integrated circuit 101) are supplied. The magnetic sensor device module 100 is provided with two sensor fields 103. Four contact holes 106 (contact parts 104) are formed in each of the sensor fields 103. A magnetic sensor element responds to a magnetic field, and the integrated circuit 101 reads out the detected magnetic field as an electric signal (sensor signal). The bonding pad part 102 is provided in order to read the sensor signal and output it to the outside.

Figure 21:
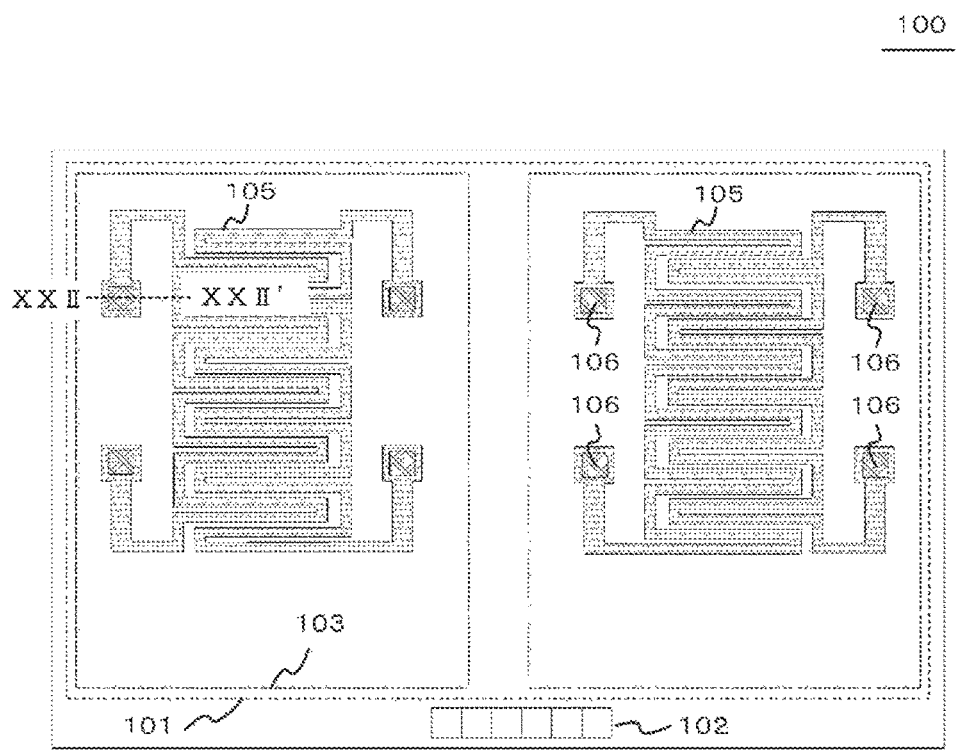
FIG. 21 is a top view for showing the magnetic sensor device module in accordance with Embodiment 4 of the present invention.

FIG. 21 shows a top view of the magnetic sensor device module in accordance with the present embodiment. The sensor field 103 (magnetic resistance thin film) is formed directly on the integrated circuit 101. Contact holes 106 (contact parts 104) and the sensor element 105 are formed in the sensor field 103 of the magnetic sensor device chip. The integrated circuit 101 receives a signal from the sensor element 105 which responded to a magnetic field, performs predetermined operation processing, and reads it out as an electric signal. A bonding pad part 102 is provided in order to supply voltage and the like for driving the device (integrated circuit 101), and read a signal and output it to the outside. The magnetic resistance thin film layer 204 of the sensor field 103 and the metal electrode 203 of the integrated circuit 101 are electrically connected at the contact hole 106 of the integrated circuit 101 (sensor field 103).

Figure 22:
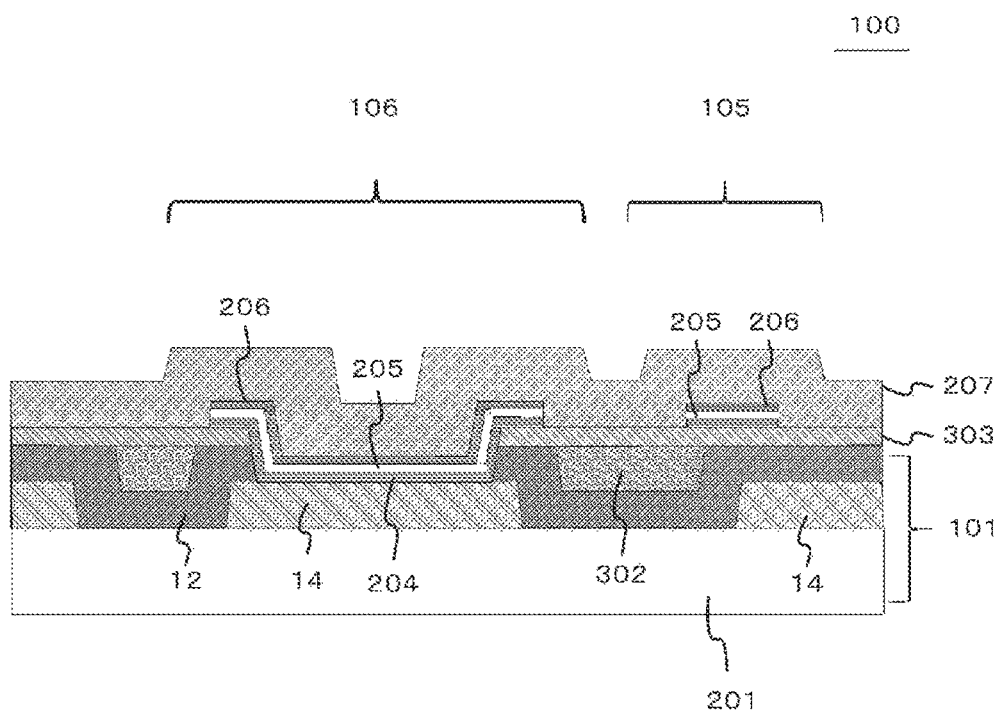
FIG. 22 is a sectional view showing the magnetic sensor device module in accordance with Embodiment 4 of the present invention.

FIG. 22 shows a fragmentary and sectional view of the sensor field 103 in the magnetic sensor device module 100 (refer to the contact hole 106 and the sensor element 105 shown in FIG. 21). The magnetic sensor device module according to the present embodiment includes an integrated circuit 101, a flattening film 302, and an insulating film 303.

The flattening film 302 is provided to make flat the difference in level of the surface of integrated circuit 101. The insulating film 303 is formed on the planarized integrated circuit 101. The contact hole 106 penetrates the protective film 12, the flattening film 302, and the insulating film 303. The metal electrode 14 and the magnetic resistance thin film layer 204 are electrically connected via the contact hole 106. On the insulating film 303, there is provided a magnetic resistance thin film layer 204, an insulating film 205, an exfoliation sacrifice film 206, a sensor element 105, a contact hole 106, and a protective film 207.

The sensor element 105 is provided with an exfoliation sacrifice film 206. The magnetic resistance thin film layer 204, the insulating film 205, and the exfoliation sacrifice film 206 are formed in the pattern of a desired shape. The protective film 207 is provided to cover the magnetic resistance thin film layer 204, the insulating film 205, and the exfoliation sacrifice film 206. In the drawing, the flattening film 302 is formed only in the concave portion of the surface difference in level of the integrated circuit. The flattening film 302 may be formed so as to cover the whole surface of the integrated circuit 101. It is to be noted that, the metal electrode 14 and the magnetic resistance thin film layer 204 are electrically connected via the contact hole 106 which penetrates the protective film 12, the flattening film 302, and the insulating film 303.

In the drawing, a sectional view is shown in which the magnetic resistance thin film layer 204, the insulating film 205, and the exfoliation sacrifice film 206 are formed in the same shape. The magnetic resistance thin film layer 204, the insulating film 205, and the exfoliation sacrifice film 206 need not to be formed in the same shape. The insulating film 205 and the exfoliation sacrifice film 206 may be formed so as to cover the magnetic resistance thin film layer 204. It is to be noted that, although the sensor element 105 and the contact hole 106 are provided with an exfoliation sacrifice film 206, either the sensor element 105 or the contact hole 106 may be provided with an exfoliation sacrifice film 206. Although the insulating film 205 and the exfoliation sacrifice film 206 are each formed of a single layer here, a period consisting of an insulating film and an exfoliation sacrifice film may be stacked in plural repeatedly.

In the next paragraphs, descriptions are made on the manufacturing method of the magnetic sensor device module of the present embodiment with reference to drawings. FIGS. 23 to 28 are sectional views for showing the processes of manufacturing the magnetic sensor device module according to Embodiment 4 of the present invention (refer to the sectional view of FIG. 22). Hereinafter, the process which was employed in the present embodiment is described step by step. The detailed configurations of the bonding pad and the integrated circuit, which are irrelevant to the features of the present invention, are omitted.

Figure 23:
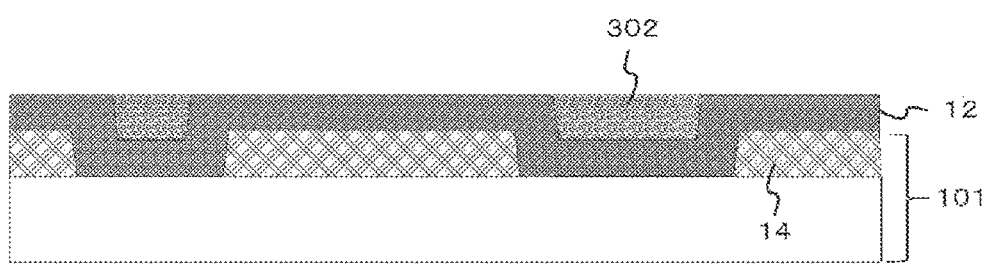
FIG. 23 is a sectional view for showing Process A of the magnetic sensor device module in accordance with Embodiment 4 of the present invention.

At first, in the process of FIG. 23, a flattening film 302 which makes flat the surface difference in level of the integrated circuit 101 is formed by using a spin coat unit. It is to be noted that, as the flattening film 302, it is desirable to employ SOG (Spin On Glass) which is excellent in the embeddedness of the concave portion of the surface of the integrated circuit 101 and, in addition, high in film hardness.

Here, there are not any particular restrictions on the material which is to be employed for forming the flattening film, as far as the material can be used for forming a flattening film in the present technical field. The flattening film 302 can be formed by carrying out the heat treatment for hardening the material, after a difference in level on the surface of the integrated circuit 101 is made flat by employing a planarization material. The conditions of the heat treatment for hardening depend on the kind of the material for planarization employed. It is allowed to set up the conditions with a timely response, taking into account the kind of the material for planarization.

Figure 24:
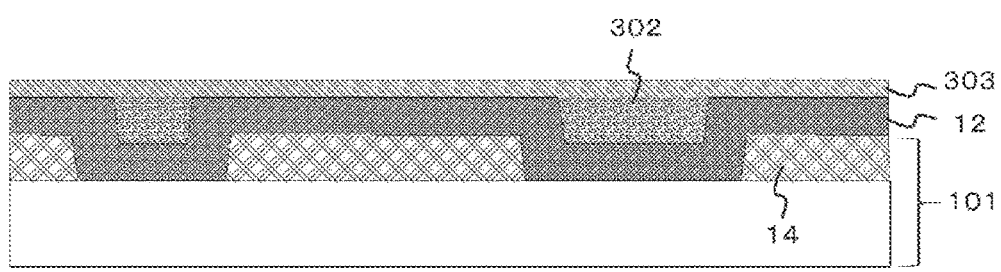
FIG. 24 is a sectional view for showing Process B of the magnetic sensor device module in accordance with Embodiment 4 of the present invention.

At the next step, in the process of FIG. 24, an insulating film 303 which serves as the foundation layer of a magnetic resistance thin film layer is formed. Here, it is preferable to form a silicon nitride film as an insulating film 303, by using a PECVD (Plasma-Enhanced Chemical Vapor Deposition) coating unit. Here, it is desirable to set up the conditions at the time of forming silicon nitride films with a timely response so that the film stress may become small. In more precise terms, the film formation conditions may be adjusted so that film stress may become no larger than $\pm 1.0 \times 10^8$ $N/m^2$.

Moreover, as for the film thickness of the insulating film 303, 0.5 μm or so is preferred from the viewpoint of a magnetic resistance film formation process. It is to be noted that, there are not any particular restrictions on the film thickness of the insulating film, as far as the film thickness is large enough to ensure the electrical insulation between the exfoliation sacrifice film and the magnetic resistance thin film layer. Furthermore, there are not any particular restrictions on the material which is to be used for forming the insulating film, as far as the material can be used for forming an insulating film in the present technical field.

Figure 25:
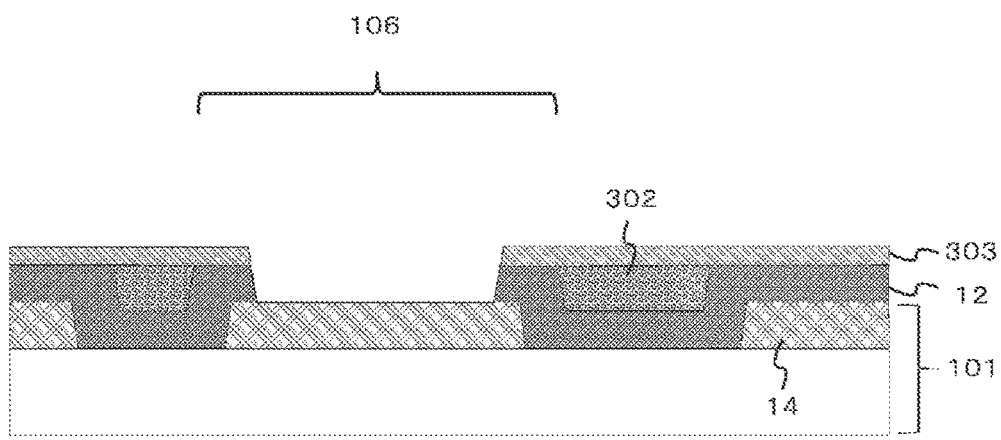
FIG. 25 is a sectional view for showing Process C of the magnetic sensor device module in accordance with Embodiment 4 of the present invention.

At the next step, in the process of FIG. 25, a contact hole 106 for electrically connecting the magnetic resistance thin film with the integrated circuit 101 is formed. For example, a portion of the integrated circuit 101 is opened, using a technique, such as a photo engraving process. The protective film 12, the flattening film 302, and the insulating film 303 are selectively removed by etching so that the metal electrode 14 may be exposed, and then a contact hole 106 is formed. It is to be noted that, as for the etching removing method, a RIE (Reactive Ion Etching) unit is preferably used to remove films by etching.

Figure 26:
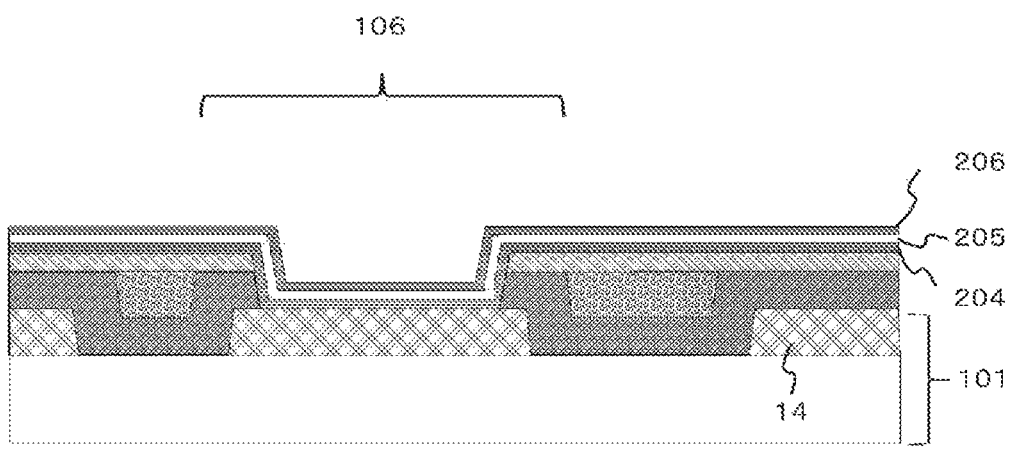
FIG. 26 is a sectional view for showing Process D of the magnetic sensor device module in accordance with Embodiment 4 of the present invention.
Figure 27:
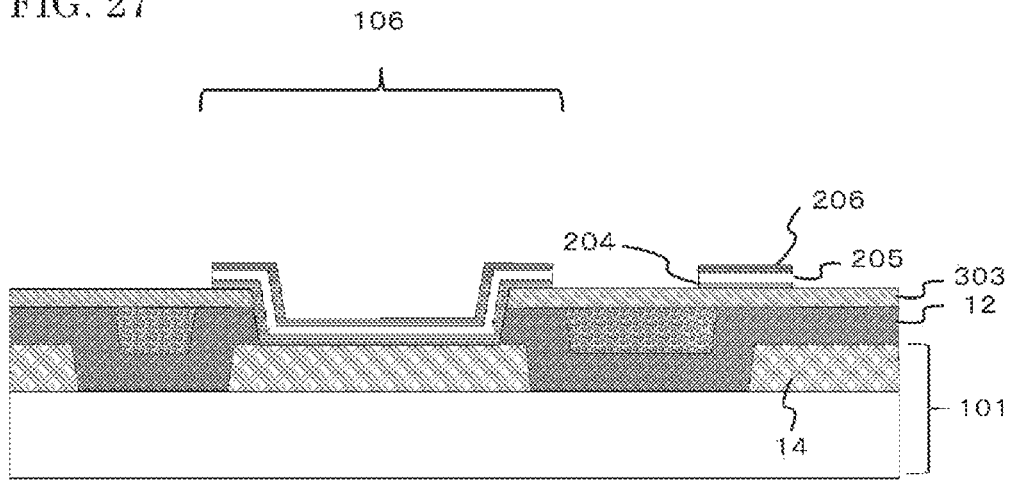
FIG. 27 is a sectional view for showing Process E of the magnetic sensor device module in accordance with Embodiment 4 of the present invention.
Figure 28:
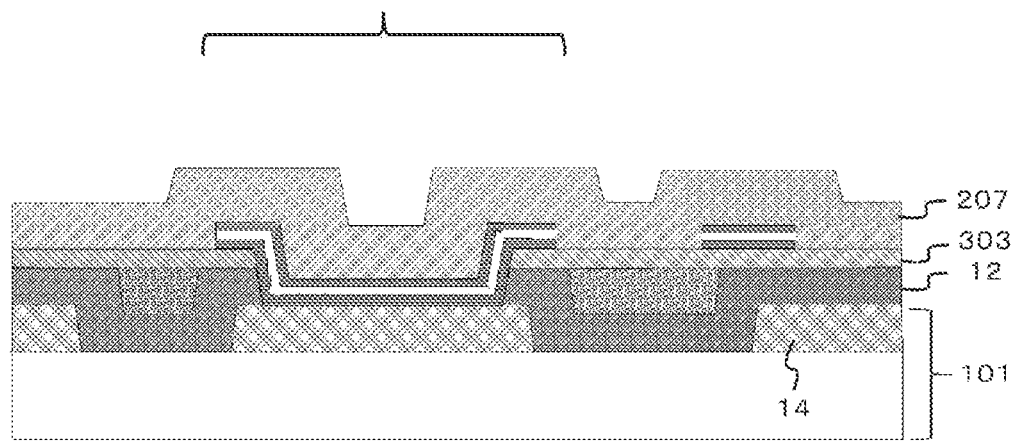
FIG. 28 is a sectional view for showing Process F of the magnetic sensor device module in accordance with Embodiment 4 of the present invention.

As for the process of FIG. 26, the process of FIG. 27, and the process of FIG. 28, explanations are the same as the process of FIG. 11C, the process of FIG. 11D, and the process of FIG. 11E of Embodiment 2, and then detailed descriptions are omitted. In this way, a sensor device module which is provided with the exfoliation sacrifice film on the magnetic resistance thin film is completed. The magnetic sensor device module according to the present embodiment is a sensor device module which includes, in a contact part, the exfoliation sacrifice film formed on the magnetic resistance thin film and is excellent in the resistance to the environment. The metal electrode and the magnetic resistance thin film layer where stress concentrates are electrically connected in the contact part.

Exfoliation in the present sensor structure is produced at upper layers of the insulating film 205 by having an exfoliation sacrifice film, when stress is applied which is large enough to cause the exfoliation of the protective film 207 and the magnetic resistance thin film layer 204 in a conventional structure. Accordingly, the magnetic resistance thin film layer 204 is protected in the present sensor structure. In particular, the present sensor structure is effective at the contact part where the stress concentrates. Moreover, there is a case where cracks are generated in the protective film 207 of the contact part by the stress of the mold resin at the heat cycle endurance test, which is performed after the sensor device module is mounted in a mold package. As a secondary effect of the present embodiment, cracks which are generated in the protective film can stop at the exfoliation sacrifice film 206, by having an exfoliation sacrifice film.

Further, stress is released and then the magnetic resistance thin film can be protected, because cracks are generated in the protective film. In addition to that, as a secondary effect, the stress is absorbed by the deformation of a metal film which constitutes the exfoliation sacrifice film, when stress is applied. Furthermore, the stress applied to the magnetic resistance thin film layer is released, because the exfoliation is generated in the sacrifice layer, when stress is applied which is large enough to cause the exfoliation. By these effects, the magnetic resistance thin film layer, which consists of an artificial lattice film and is comparatively vulnerable to the change in the magnetic property due to the stress, can be easily restrained in the change of property.

A sensor device module according to Embodiment 1 or 3 has features in that the sensor device module consists of a layered metal thin film which includes a single layered metal thin film or a lamination film which contains two or more kinds of layered metal thin films, an insulating film to be formed on the above-mentioned layered metal thin film, an exfoliation sacrifice film to be formed on the insulating film, and a protective film to be formed on the above-mentioned exfoliation sacrifice film. The sensor device module is characterized in that the above-mentioned protective film and the above-mentioned insulating film are made from the same material, and at least one of the upper most layer and the lower most layer which constitute the above-mentioned exfoliation sacrifice film, is made from the same material as the upper most layer of the above-mentioned layered metal thin film. It is to be noted that the upper most layer of the layered metal thin film indicates the single layered metal thin film itself, when the layered metal thin film consists of a single layered metal thin film.

The protective film and the layered metal thin film will exfoliate, due to the internal stress of the protective film, the stress resulting from the external stress applied from the mold resin through the protective film, and the like. In the structure of the present invention, the exfoliation sacrifice film is provided on the layered metal thin film. Accordingly, exfoliation is produced in the exfoliation sacrifice film and then the layered metal thin film is protected. Therefore, according to the present invention, the fall of the reliability by the exfoliation of a protective film and a layered metal thin film can be prevented appropriately. It is to be noted that, the exfoliation sacrifice film also includes a case where it is made of a single film, although it in general contains a plurality of films. In the case of a single film, the upper most layer or the lower most layer indicates the single film itself.

A sensor device module according to Embodiment 2 or 4 has features in that the sensor device module consists of a layered metal thin film which includes a single layered metal thin film or a lamination film which contains two or more kinds of layered metal thin films, an insulating film to be formed on the above-mentioned layered metal thin film, an exfoliation sacrifice film to be formed on the insulating film, and a protective film to be formed on the above-mentioned exfoliation sacrifice film. The sensor device module is characterized in that the above-mentioned protective film and the above-mentioned insulating film are made from the different materials, and at least one of the upper most layer and the lower most layer which constitute the above-mentioned exfoliation sacrifice film, is made from the same material as the upper most layer of the above-mentioned layered metal thin film. It is to be noted that the upper most layer of the layered metal thin film indicates the single layered metal thin film itself, when the layered metal thin film consists of a single layered metal thin film.

A sensor device module according to Embodiment 3 or 4 is characterized in that the sensor device module consists of a layered metal thin film which is to be formed on the metal electrode at the contact part where the metal electrode and the layered metal thin film are electrically connected, an insulation film to be formed on the layered metal thin film, an exfoliation sacrifice film to be formed on the insulating film, and a protective film to be formed on the exfoliation sacrifice film. It is to be noted that, the exfoliation sacrifice film also includes a case where it is made of a single film, although it in general contains a plurality of films. In the case of a single film, the upper most layer or the lower most layer indicates the single film itself.

The sensor device module according to Embodiment 3 or 4 is a sensor device module in which an interlayer insulating film which consists of a flattening film is used for flattening a difference in level of the integrated circuit which performs predetermined operation processing, and a layered metal thin film is formed directly on the integrated circuit. The sensor device module is characterized in that, at the contact hole where a portion of the interlayer insulating film is opened to expose a metal electrode of the integrated circuit and the metal electrode and the layered metal thin film are electrically connected, the module consists of a layered metal thin film which is to be formed on the metal electrode, an insulation film which is to be formed on the thin film having a sensor function, an exfoliation sacrifice film which is to be formed on the insulating film, and a protective film which is to be formed on the exfoliation sacrifice film.

A sensor device module, according to the present invention, includes a substrate on which a sensor element that is covered with a protective film and has a pattern is formed, an integrated circuit which is formed on the substrate, and processes an output of the sensor element to calculate a sensor signal, and a bonding pad part which is formed on the substrate and into which electric power supplied to the integrated circuit is inputted; wherein the integrated circuit and the sensor element are connected at a contact part, and the sensor element and the contact part have a layered metal thin film which consists of first metal layers and second metal layers, each layer stacked one above the other, an insulating film which is formed on the layered metal thin film and made from the same material as the protective film, and an exfoliation sacrifice film which is formed on the insulating film and in contact with the protective film, further wherein an upper most layer or a lower most layer of the exfoliation sacrifice film is made from the same material as an upper most layer of the layered metal thin film.

A sensor device module, according to the present invention, a substrate on which a sensor element that is covered with a protective film and has a pattern is formed, an integrated circuit which is formed on the substrate and processes an output of the sensor element to calculate a sensor signal, and a bonding pad part which is formed on the substrate and into which electric power supplied to the integrated circuit is inputted; wherein the integrated circuit and the sensor element are connected at a contact part, and the sensor element and the contact part have a layered metal thin film which consists of first metal layers and second metal layers, each layer stacked one above the other, an insulating film which is formed on the layered metal thin film and made from the material different from that of the protective film, and an exfoliation sacrifice film which is formed on the insulating film and in contact with the protective film, further wherein a lower most layer of the exfoliation sacrifice film is made from the same material as an upper most layer of the layered metal thin film.

A sensor device module, according to the present invention, a substrate on which a sensor element that is covered with a protective film and has a pattern is formed, an integrated circuit which is formed on the substrate and processes an output of the sensor element to calculate a sensor signal, and a bonding pad part which is formed on the substrate and into which electric power supplied to the integrated circuit is inputted; wherein the integrated circuit and the sensor element are connected at a contact part, and the sensor element and the contact part have a layered metal thin film which consists of a single metal layer, an insulating film which is formed on the layered metal thin film, and an exfoliation sacrifice film which is formed on the insulating film and in contact with the protective film, further wherein an upper most layer or a lower most layer of the exfoliation sacrifice film is made from the same material as the layered metal thin film.

A peel off test (tape exfoliation test) is carried out to evaluate the exfoliation sacrifice film. On a silicon substrate, an insulating film 202, a magnetic resistance thin film layer 204, and an insulating film 205, an exfoliation sacrifice film 206, a protective film 207 are formed in sequence. After that, etching removal were carried out to the magnetic resistance thin film layer 204, the insulating film 205, the exfoliation sacrifice film 206, and the protective film 207, so that they were made into a grid pattern. A test sample is then obtained. As for the material and film thickness of each layer, the exfoliation sacrifice film 206 and the insulating film 205 were each made in two conditions. A total of four conditions are employed to make samples, with other parameters in a single condition.

In more precise terms, an insulating film 202 of silicon nitride film is formed at 0.5 μm in film thickness. As for the magnetic resistance thin film layer 204, a lamination structure is formed which includes 20 periods (700 Å) of the layered product, where each period includes the layered product of a magnetic layer (Fe(x) Co(1−x) (0≤x≤0.3)) and a non-magnetic layer (Cu). The layer which is in contact with the insulating film 205 is Fe(x) Co(1−x). Moreover, a protective film 207 of silicon nitride film was formed at 0.75 μm. Insulating films 205 of silicon nitride film were formed at two conditions of 0.02 μm and 0.2 μm. Exfoliation sacrifice films were formed at two conditions, where a Fe(x) Co(1−x) (0≤x≤0.3) monolayer (50 Å) and the same product of the magnetic resistance thin film layer 204 are included.

An adhesive tape was press held on the protective film 207 of a test sample prepared in these ways, and then the adhesive tape was peeled off. Analysis was provided on the test samples in which exfoliations were produced. A judging standard is employed whether exfoliations were produced at the upper layers of the insulating film 205 or not. As a result of the analysis of the exfoliation layers, it is confirmed that exfoliations in the test samples of all four conditions were produced at the upper layers of the insulating film 205.

It should be noted that each embodiment of the present invention may be freely combined, or appropriately modified or omitted within the spirit and scope of the invention.

EXPLANATION OF NUMERALS AND SYMBOLS

100 Magnetic Sensor Device Module 101 Integrated Circuit 102 Bonding Pad Part 103 Sensor Field 104 Contact Part 105 Sensor Element 106 Contact Hole 201 Substrate 202 Insulating Film 203 Metal Electrode 204 Magnetic Resistance Thin Film Layer 205 Insulating Film 206 Exfoliation sacrifice film 207 Protective Film 302 Flattening film 303 Insulating Film 12 Protective Film 14 Metal Electrode 204U Upper Most layer 204a First Metal Layer 204B Second Metal Layer 206L Lower Most layer 206U Upper Most layer

What is claimed is:
1. A sensor device module, comprising
a substrate on which a sensor element that is covered with a protective film and has a pattern is formed,
an integrated circuit which is formed on the substrate, and processes an output of the sensor element to calculate a sensor signal, and
a bonding pad part which is formed on the substrate and into which electric power supplied to the integrated circuit is inputted;
wherein the integrated circuit and the sensor element are connected at a contact part, and
the sensor element and the contact part have
a layered metal thin film which consists of first metal layers and second metal layers, each layer stacked one above the other,
an insulating film which is formed on the layered metal thin film and made from the same material as the protective film, and
an exfoliation sacrifice film which is formed on the insulating film and in contact with the protective film, further wherein an upper most layer or a lower most layer of the exfoliation sacrifice film is made from the same material as an upper most layer of the layered metal thin film.
2. The sensor device module as set forth in claim 1, wherein the integrated circuit is formed in an area different from that of the sensor element.
3. The sensor device module as set forth in claim 1, wherein the integrated circuit is formed under the sensor element.
4. The sensor device module as set forth in claim 1, wherein the contact part and the sensor element are formed on the same insulating film.
5. The sensor device module as set forth in claim 1, wherein the contact part is formed in a contact hole.
6. The sensor device module as set forth in claim 1, wherein the integrated circuit and the sensor element are connected by an aluminum wiring which is formed on the insulating film.
7. The sensor device module as set forth in claim 1, wherein the first metal layer and the second metal layer consist of a Cu layer and a Fe(x) Co(1−x) (0≤x≤0.3) layer.
8. A sensor device module, comprising
a substrate on which a sensor element that is covered with a protective film and has a pattern is formed,
an integrated circuit which is formed on the substrate and processes an output of the sensor element to calculate a sensor signal, and
a bonding pad part which is formed on the substrate and into which electric power supplied to the integrated circuit is inputted;
wherein the integrated circuit and the sensor element are connected at a contact part, and
the sensor element and the contact part have
a layered metal thin film which consists of a single metal layer,
an insulating film which is formed on the layered metal thin film, and an exfoliation sacrifice film which is formed on the insulating film and in contact with the protective film, further wherein an upper most layer or a lower most layer of the exfoliation sacrifice film is made from the same material as the layered metal thin film.

9. The sensor device module as set forth in claim 8, wherein the integrated circuit is formed in an area different from that of the sensor element.

10. The sensor device module as set forth in claim 8, wherein the integrated circuit is formed under the sensor element.

11. The sensor device module as set forth in claim 8, wherein the contact part and the sensor element are formed on the same insulating film.

12. The sensor device module as set forth in claim 8, wherein the contact part is formed in a contact hole.

13. The sensor device module as set forth in claim 8, wherein the integrated circuit and the sensor element are connected by an aluminum wiring which is formed on the insulating film.

* * * * *